United States Patent
Tran et al.

(10) Patent No.: US 6,885,600 B2
(45) Date of Patent: Apr. 26, 2005

(54) DIFFERENTIAL SENSE AMPLIFIER FOR MULTILEVEL NON-VOLATILE MEMORY

(75) Inventors: Hieu Van Tran, San Jose, CA (US); Jack Edward Frayer, Boulder Creek, CA (US); William John Saiki, Mountain View, CA (US); Michael Stephen Briner, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 117 days.

(21) Appl. No.: 10/241,266

(22) Filed: Sep. 10, 2002

(65) Prior Publication Data

US 2004/0047184 A1 Mar. 11, 2004

(51) Int. Cl.[7] .............................................. G11C 17/00
(52) U.S. Cl. .................. 365/205; 365/185.21; 365/196; 365/207; 365/210
(58) Field of Search ................................ 365/205, 207, 365/210, 185.21, 196

(56) References Cited

U.S. PATENT DOCUMENTS

| | | | | |
|---|---|---|---|---|
| 4,242,739 A | * | 12/1980 | Hori et al. ................... | 365/203 |
| 5,517,462 A | * | 5/1996 | Iwamoto et al. ............. | 365/233 |
| 5,717,632 A | * | 2/1998 | Richart et al. ............ | 365/185.2 |
| 6,574,129 B1 | * | 6/2003 | Tran ............................. | 365/94 |
| 6,597,598 B1 | * | 7/2003 | Tran et al. .................... | 365/94 |

* cited by examiner

Primary Examiner—Viet Q. Nguyen
(74) Attorney, Agent, or Firm—Gray Cary Ware & Freidenrich LLP

(57) ABSTRACT

A digital multilevel non-volatile memory includes a massive sensing system that includes a plurality of sense amplifiers disposed adjacent subarrays of memory cells. The sense amplifier includes a high speed load, a wide output range intermediate stage and a low impedance output driver. The high speed load provides high speed sensing. The wide output range provides a sensing margin at high speed on the comparison node. The low impedance output driver drives a heavy noisy load of a differential comparator. A precharge circuit coupled to the input and output of the sense amplifier increases the speed of sensing. A differential comparator has an architecture that includes analog bootstrap. A reference sense amplifier has the same architecture as the differential amplifier to reduce errors in offset. The reference differential amplifier also includes a signal multiplexing for detecting the contents of redundant cells and reference cells.

23 Claims, 12 Drawing Sheets

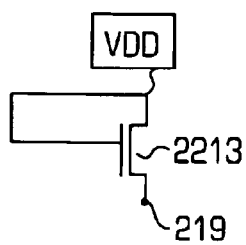
FIG. 2C
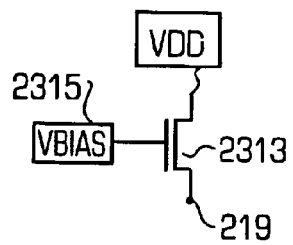
FIG. 2D
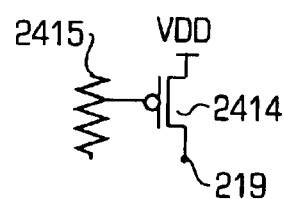
FIG. 2E
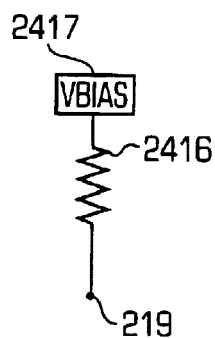
FIG. 2F
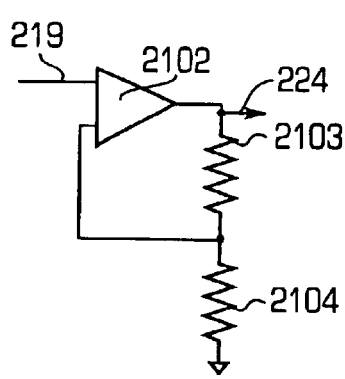
FIG. 2G
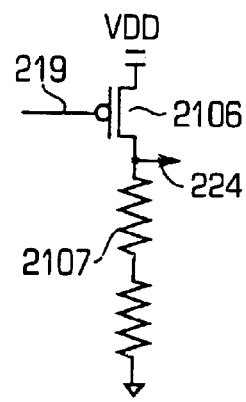
FIG. 2H
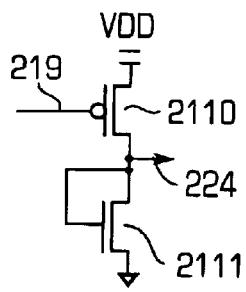
FIG. 2I
FIG. 2J
FIG. 2K
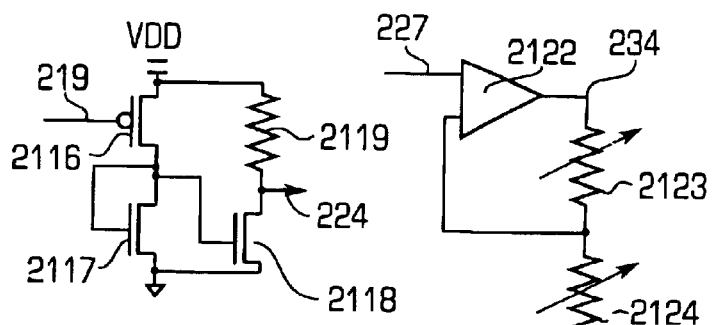
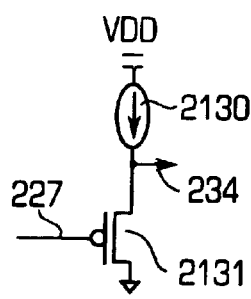
FIG. 2L
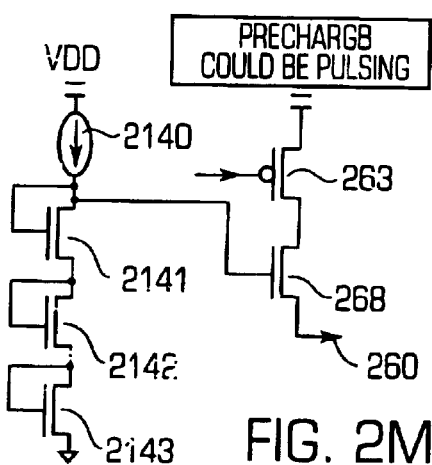
FIG. 2M

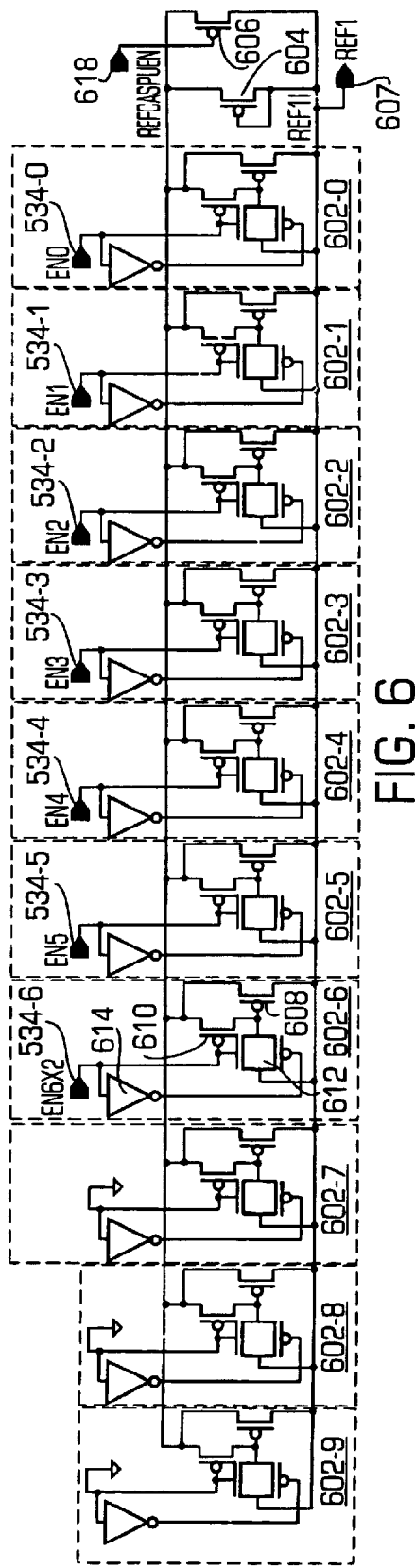
FIG. 6
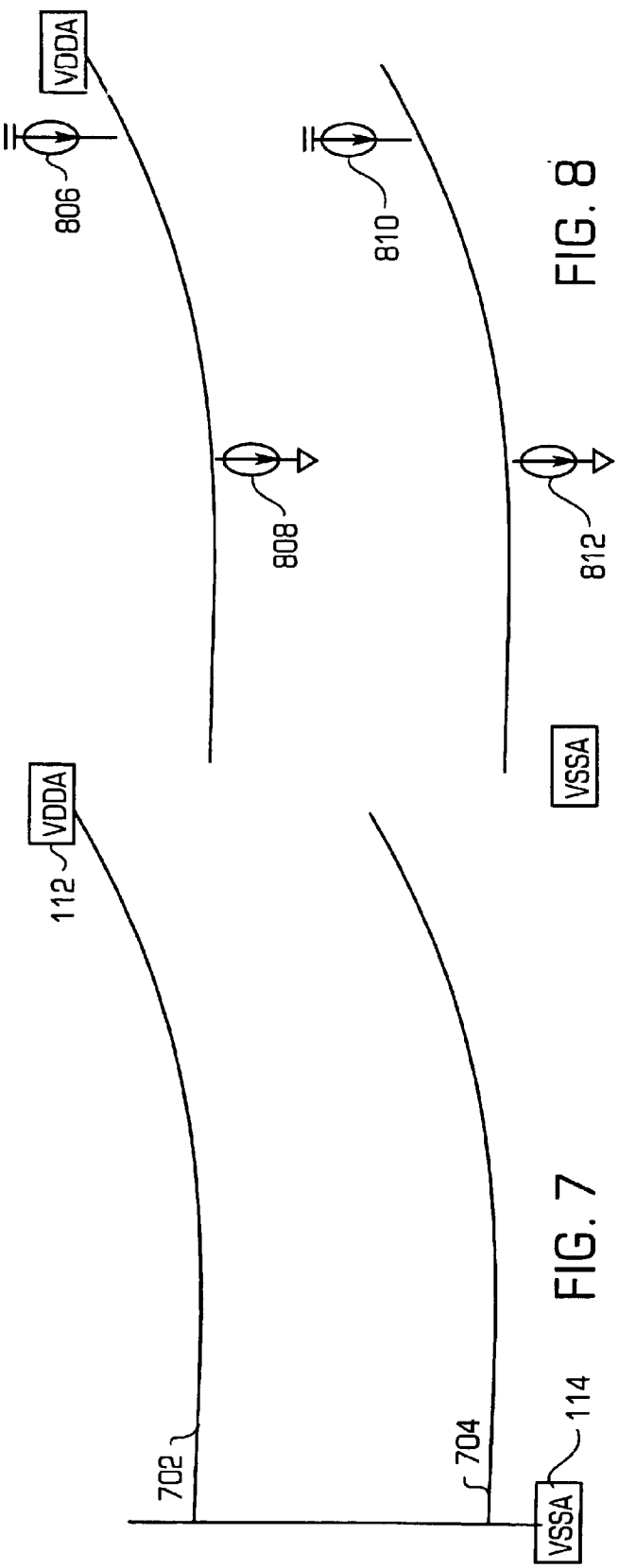
FIG. 7
FIG. 8

US 6,885,600 B2

DIFFERENTIAL SENSE AMPLIFIER FOR MULTILEVEL NON-VOLATILE MEMORY

CROSS REFERENCE TO RELATED APPLICATIONS

This application is related to U.S. patent application Ser. No. 10/241,442 filed on even date herewith, entitled "High Speed And High Precision Sensing For Digital Multilevel Non-Volatile Memory System", inventors Hieu Van Tran, Jack Edward Frayer, William John Saiki, and Michael Stephen Briner, the disclosure of which is incorporated herein by reference.

BACKGROUND OF THE INVENTION

As information technology progresses at an unprecedented pace, the need for information storage increases proportionately. Accordingly, the non-volatile information in stationary or portable communication demands higher capability and capacity storage. One approach to increasing the amount of storage is by decreasing physical dimensions of the stored bit (e.g., memory cell) to smaller dimensions, such as the nano cell technology. Another approach is to increase the stored density per bit. This second approach is known as digital multilevel non-volatile storage technology.

A sense amplifier reads the content of a memory cell. It is desired to have a sense amplifier that can accurately detect at high speed the voltage stored in a multilevel non-volatile memory cell and that uses low power.

SUMMARY OF THE INVENTION

The present invention provides a differential sense amplifier for a non-volatile memory. In one aspect, the differential sense amplifier may compare a voltage on a bitline coupled to a memory cell and a reference voltage to determine the content of the memory cell.

In another aspect, the differential sense amplifier comprises a preamplifier stage that provides first and second preamp output signals in response to first and second input signals. The differential sense amplifier also comprises a latch analog bootstrap amplifier stage coupled to the preamplifier stage to latch the first and second preamp output signals, and, in response thereto, provide first and second amplifier output signals.

In another aspect, the preamplifier stage includes a folded cascode amplifier and a gain enhancement circuit.

BRIEF DESCRIPTION OF THE DRAWINGS

FIGS. 2C, 2D, 2E, and 2F are block diagrams illustrating a load of the sense amplifier of FIGS. 2A and 2B according to first, second, third, and fourth alternate embodiments, respectively.

FIGS. 2G, 2H, 2I, and 2J are block diagrams illustrating a wide output gain stage of the sense amplifier of FIGS. 2A and 2B according to first, second, third, and fourth alternate embodiments, respectively.

FIGS. 2K and 2L are block diagrams illustrating a low impedance output stage of the sense amplifier of FIGS. 2A and 2B according to first and second alternate embodiments, respectively.

FIG. 2M is a block diagram illustrating a precharge circuit of the sense amplifier of FIGS. 2A and 2B according to a first embodiment.

FIG. 6 is a block diagram illustrating a pull-up circuit of the reference cascode pull-up driver of FIG. 5.

FIG. 7 is a graph illustrating an IR drop along a sense amplifier of the non-volatile multilevel memory system of FIG. 1.

FIG. 8 is a graph illustrating an IR drop along a sense amplifier 110 that includes compensated currents of the non-volatile multilevel memory system of FIG. 1.

DETAILED DESCRIPTION

As used herein, "data cell" refers to the regular data memory cells, "reference cell" refers to memory cells being used as to generate reference levels for sensing, "redundant cell" refers to memory cells being used to replace defective data cells.

As used herein, a N-type NMOS enhancement transistor is an enhancement transistor having a gate threshold, for example in the range of approximately 0.3 to 1.0 volts. A P-type transistor is a PMOS enhancement transistor having a gate threshold approximately in the range of −0.3 to −1.0 volts. An NZ NMOS transistor is a native low voltage transistor having a gate threshold approximately in the range of −0.1 to 0.2 volts.

Figure 1:
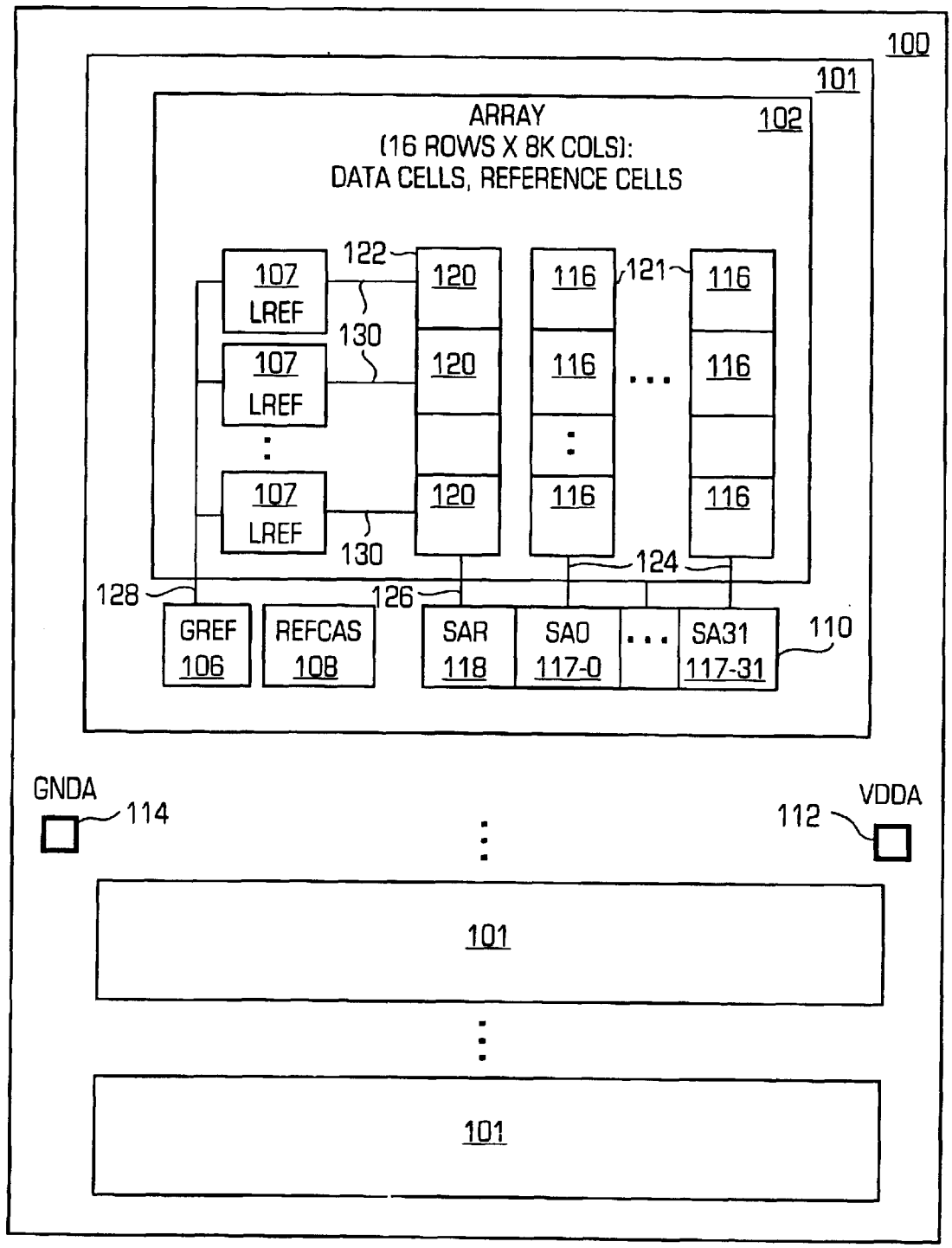
FIG. 1 is a block diagram illustrating a non-volatile multilevel memory system.

FIG. 1 is a block diagram illustrating a non-volatile multilevel memory system 100.

The non-volatile multilevel memory system 100 comprises a plurality of arrays 101. (For clarity, only three arrays 101 are shown, and the details of only one array 101 is shown.) Each array 101 comprises a memory array 102, a global reference level (GREF) generator 106, a plurality of local reference level (LREF) generators 107, a reference cascode pull-up circuit (REFCAS) 108, a sense amplifier 10, a sense amplifier voltage (VDDA) pad 112, and a sense amplifier ground (GNDA) pad 114.

The non-volatile multilevel memory system 100 may also include a charge pump, a high voltage generator, control circuits, input/output circuits, and other voltage and ground pads, which are not shown in FIG. 1. In one embodiment, the architecture of the memory array 101 may be the array architecture described in U.S. Pat. No. 6,282,145, entitled "Array Architecture and operating methods for digital multilevel nonvolatile memory integrated circuit system", assigned to the same assignee as this patent application, the subject matter of which is incorporated herein by reference.

The array 102 comprises a plurality of data memory cells 116 arranged in columns 121, a plurality of reference memory cells 120 arranged in a column 122, and a plurality of decoders (not shown). In one embodiment, the memory cells are arranged in 16K rows by 8K columns. In one embodiment, the memory array includes a source side injection flash technology, which uses lower power in hot electron programming and efficient injector based Fowler-Nordheim tunneling erasure. The programming is done by applying a high voltage on the source of the memory cell, a bias voltage on the control gate of the memory cell, and a bias current on the drain of the memory cell. The erase is done by applying a high voltage on the control gate of the memory cell and a low voltage on the source and/or drain of the memory cell. The verify (sensing or reading) is done by placing the memory cell in a voltage mode sensing, e.g., a bias voltage on the source, a bias voltage on the gate, a bias current on the drain, and the voltage on the drain is the readout voltage. In another embodiment, the verify (sensing or reading) is done by placing the memory cell in a current mode sensing, e.g., a low voltage on the source, a bias voltage on the gate, a load (resistive or transistors) coupled to the drain, and the voltage on the load is the readout voltage.

The global reference level (GREF) generator 106 generates global reference voltages 128 used for global reading and writing of the data memory cells 116 and the reference memory cells 120 in the memory array 101. For clarity, only one line is shown for the global reference voltages 128, but the number of lines depends on the number of voltages used for programming the multilevels.

The local reference level (LREF) generator 107 generates reference voltages 130 from the global reference voltages for local reading and writing of the data memory cells 116 and reference memory cells 120 in the array 102. For clarity, only one line is shown for the local reference voltages 130, but the number of lines depends on the number of voltages used for programming the multilevels.

In one embodiment, the global reference generator 106 comprises four reference memory cells with outputs corresponding to four global reference voltage levels (GREF0) 128-0, (GREF1) 128-1, (GREF2) 128-2, and (GREF3) 128-3. The global reference voltage (GREF0) 128-0 is used as a global erase reference level. In one embodiment, the local reference generator 107 comprises local memory cells generating three local reference levels (REF1) 130-1, (REF2) 130-2, and (REF3) 130-3.

The global reference level generator 106 comprises memory cells for storing the global reference levels (GREF0-3) 128. The global reference levels (GREF0-3) 128 may be generated at test through a tester (not shown) or on-chip to desired voltage levels. The local reference level generator 107 comprises memory cells for storing the local reference levels 130. The local reference levels 130 may be generated on-chip through chip operation such as by reference erase and programming. The local reference levels 130 are programmed by incremental programming, in which the levels 130 are successively incrementally verified and programmed until reaching desired levels. The verify is against the global reference levels (GREF0-3) 128-0 through 128-3. Then in the normal operation of the system, the data cells 116 are programmed by an incremental programming procedure, and may be successively incrementally verified and programmed until reaching desired levels. The verify of the data cells 116 is against the global reference level (GREF0) 128-0 for an erase level and is against the local reference levels (GREF 1-3) 130 for programmed levels.

In another embodiment, the global reference levels 128 are derived from a bandgap referred voltage generator (not shown).

In another embodiment of local reference levels, the memory cells are programmed at the test though a tester (not shown).

The reference cascode pull-up circuit 108 provides pull-up for the local reference levels 130-1 through 130-3. The reference cascode pull-up circuit 108 controls sensing margining.

The sense amplifier 110 interfaces with the array 102 for reading and writing the memory cells. The sense amplifier 110 comprises a plurality of sense amplifiers 117-0 through 117-31 and a reference sense amplifier 118. In one embodiment, the reference sense amplifier 118 includes a plurality of reference sense amplifiers. Each sense amplifier 117 is coupled by a bit line 124 to a corresponding column 121 of memory data cells 116. The reference sense amplifier 118 is coupled by a bit line 126 to a corresponding column 122 of reference data cells 120. In one embodiment, the sense amplifier 110 comprises thirty-two sense amplifiers 117 and one reference sense amplifier 118. This allows 32 bits to be sensed at the same time. The sense amplifier 110 may use other numbers of sense amplifiers 117. In one embodiment, each sense amplifier 117 comprises three differential amplifiers 272 (see FIG. 2) and the reference sense amplifier 118 includes three differential amplifiers 472 (see FIG. 4). In this embodiment, an array 102 includes 99 differential amplifiers. In alternative embodiments, each sense amplifier 117 and reference sense amplifier 118 includes 1 or 2 differential amplifiers for a total of 33 or 66 differential amplifiers, respectively. In one embodiment, the reference sense amplifier 118 reads the contents of reference and redundant cells. In another embodiment, a plurality of separate sense amplifiers that are each similar to the reference sense amplifier 118 may be used to read the content of the redundant cells.

The sense amplifier voltage pad (VDDA) 112 is shown on the right side of FIG. 1 and the sense amplifier ground pad (GNDA) 114 is shown on the left side of FIG. 1 for illustrative purposes to illustrate the voltage drop described below in conjunction with FIG. 7 and 8.

Figure 2A:
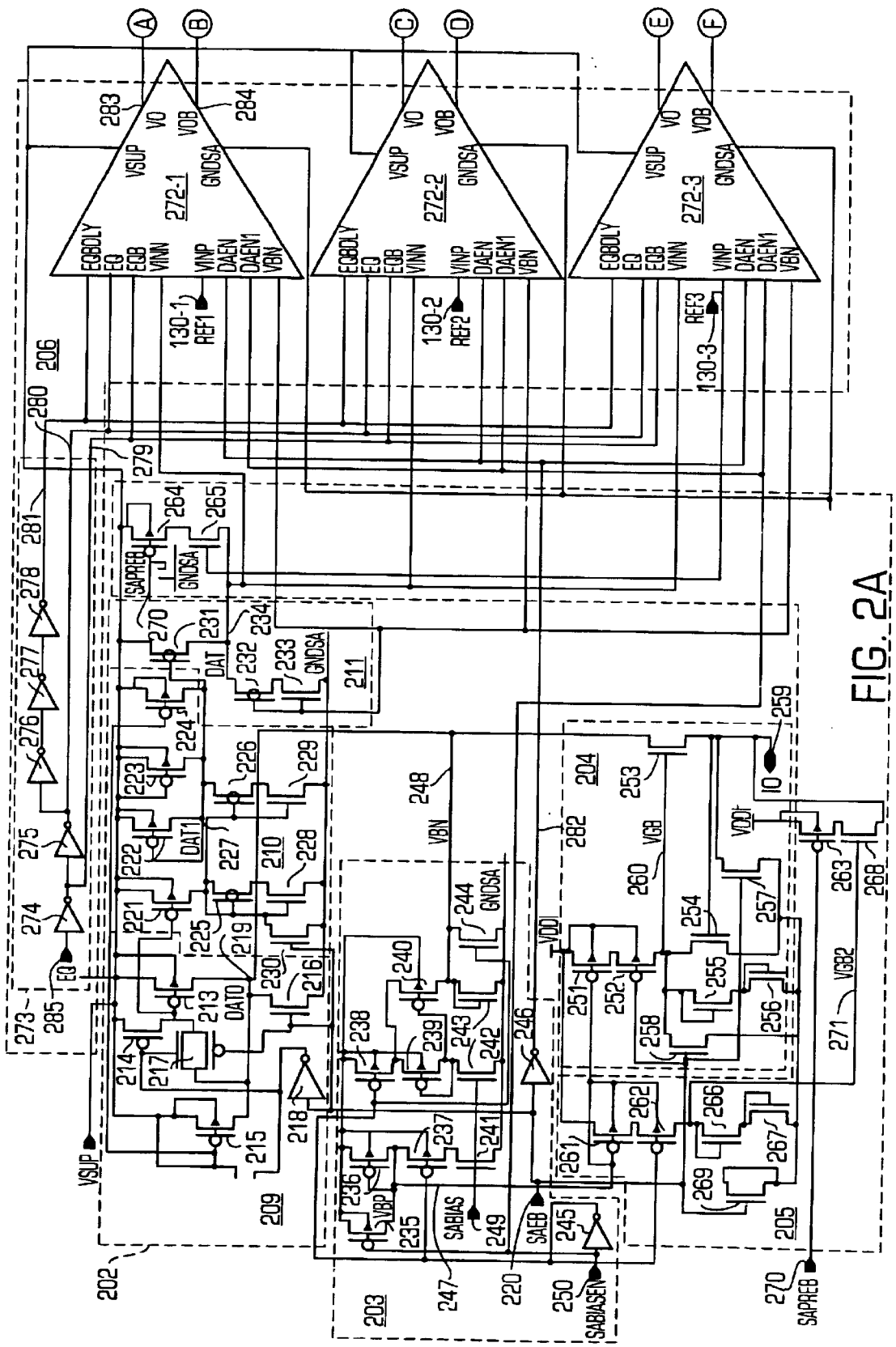
FIGS. 2A and 2B are block diagrams illustrating a sense amplifier of the nonvolatile memory system of FIG. 1.
Figure 2B:
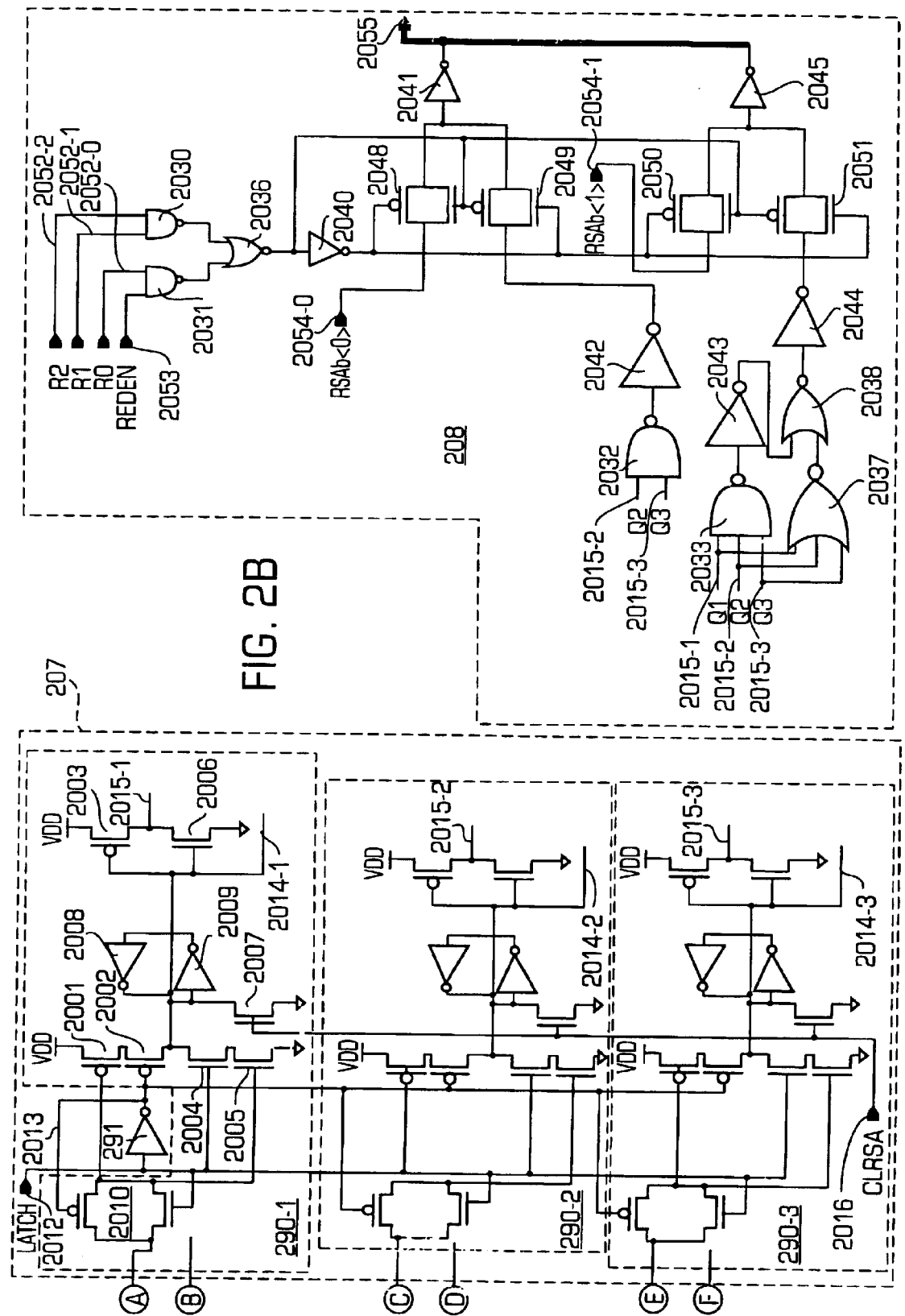

FIGS. 2A and 2B are block diagrams illustrating the sense amplifier 117.

The sense amplifier 117 comprises an input stage 202, a bias generator 203, a feedback cascoding circuit 204, a precharge circuit 205, a differential comparator 206, a latch circuit 207, and a decoder circuit 208.

In one embodiment, the sense amplifier 117 provides a high speed load on the bit line 124. The bitline 124 is coupled to the input/output (IO) line 259 through decoding circuitry (not shown). The high speed load provides high speed sensing of the contents of the data memory cell 116. In one embodiment, the sense amplifier provides a level shift for a wide output range. The sense amplifier 117 has a wide output range to provide a sufficient sensing margin at high speed at a comparison node that holds a voltage indicative of the sensed contents of the data memory cell 116 for comparison by a comparator, such as a differential amplifier. The sense amplifier 117 provides a low impedance on the comparison load for driving a heavy and noisy load.

The input stage 202 includes a high speed load stage 209, a wide output gain stage 210, and a low impedance output stage 211.

The high speed load stage 209 comprises a plurality of PMOS transistors 213, 214, and 215, an NMOS transistor 216, a multiplexer 217, and an inverter 218.

A first data node (DAT0) 219 is coupled through the feedback cascoding circuit 204 to the bit line 124. The PMOS transistor 213 provides a load on the first data node (DAT0) 219. The PMOS transistor 214, the inverter 218, and the multiplexer 217 enable or disable the gate of the PMOS transistor 213 with the supply voltage VDD. In one embodiment, the first node (DAT0) 219 is disabled to ground by the NMOS transistor 216 in response to an enable sense amplifier (SAEB) signal 220. In another embodiment, the first data node (DAT0) 219 is disabled to the supply voltage VDD by the PMOS transistor 215.

Because the first data node (DAT0) 219 sees a large capacitance from the bit line 124, the size of the PMOS transistor 213 is made large to speed up the settling at the first data node (DAT0) 219. Because there is a following gain stage 210 and a low impedance output stage 211 before going into the differential amplifier 272 (see below) of the differential comparator circuit 206, the voltage swing reduction due to a strong PMOS transistor 213 is not averse to sensing. Because the load of the PMOS transistor 213 may be optimized for speed, it has the additional advantage of helping the settling time of the feedback because the combined Rload*Cbitline (resistance of the transistor 213 times the capacitance of the bit line 124) is small. The PMOS transistor 215 pulls up the first data node (DAT0) 219. In another embodiment, the PMOS transistor 215 may be enabled by the inverter 218 in response to an enable sense amplifier (SAEB) signal 220.

FIG. 2C is a block diagram illustrating a load as an alternate embodiment of the PMOS transistor 213. A diode-connected NMOS transistor 2213 is coupled between the supply voltage VDD and the first data node 219. The NMOS transistor 2213 replaces the PMOS transistor 213 of FIG. 2A.

FIG. 2D is a block diagram illustrating a load as an alternate embodiment of the PMOS transistor 213. An NMOS transistor 2313 is coupled between the supply voltage VDD and the first data output node 219. A bias voltage source 2315 biases the gate of the NMOS transistor 2313 to isolate the variation of the power supply VDD on the first data node 219.

FIG. 2E is a block diagram illustrating a load as another alternate embodiment of the PMOS transistor 213. A PMOS transistor 2414 is coupled between the power supply VDD and the first data node 219. The PMOS transistor 2414 is biased by a linear voltage source 2415, which may be a resistor divider network or a voltage divider comprised of MOS transistors.

FIG. 2F is a block diagram illustrating a load as another alternate embodiment of the PMOS transistor 213. A resistor 2416 is coupled between a bias voltage (VBIAS) 2417 and the first data node 219.

Refer again to FIGS. 2A and 2B. The wide output gain stage 210 comprises a plurality of PMOS transistors 221 through 224, a plurality of NZ NMOS transistors 225 and 226, and a plurality of NMOS transistors 228 through 230. The gate of the PMOS transistor 221 is coupled to the gate of the PMOS transistor 213. The PMOS transistor 221 mirrors from the PMOS transistor 213. The drain-source terminals of the PMOS transistor 221, the NZ NMOS transistor 225, and the NMOS transistor 228 are coupled between the supply voltage VDD and ground. The drain-source terminals of the diode-connected PMOS transistor 222, the NZ NMOS transistor 226, and the NMOS transistor 229 are coupled between the supply voltage VDD and ground. The gates of the NMOS transistors 225, 226, 228, 229 are coupled to the drain of the PMOS transistor 221. The NMOS transistors 229 and 226 mirror from the NMOS transistors 228 and 225. The PMOS transistor 222 converts a current from the PMOS transistor 221 into a voltage output on a second data node (DAT1) 227 coupled to the drain of the PMOS transistor 222. The PMOS transistor 223 biases the second data node (DAT1) 227. The drain-source terminals of the PMOS transistor 224 pulls up the second data node (DAT1) 227 to the supply voltage VDD in a disable state. In another embodiment, the NMOS transistor 230 pulls the second data node (DAT1) 227 to ground in a disable state in response to the enable sense amplifier (SAEB) signal 220. The size ratio of the PMOS transistor 222 to the PMOS transistor 213 determines the gain of the wide output gain stage 210.

FIG. 2G is a block diagram illustrating a wide output gain stage 210 in accordance with a first alternate embodiment. An operational amplifier 2102 generates the second data node 224 with feedback through a resistor divider network formed of resistors 2103 and 2104 coupled between the second output data node 224 and ground. A common node formed between the resistors 2103 and 2104 provides the feedback for the operational amplifier 2102. The first data node 219 is applied to another input of the operational amplifier 2102.

FIG. 2H is a block diagram illustrating a wide output gain stage 210 according to a second alternate embodiment. A PMOS transistor 2106 and a resistor 2107 are coupled in series between the supply voltage VDD and ground. The gate of the PMOS transistor 2106 is biased by the first data node 219. The drain of the PMOS transistor 2106 is coupled to the second data node 224.

FIG. 2I is a block diagram illustrating a wide output gain stage 210 according to a third alternate embodiment. A PMOS transistor 2110 and a diode connected NMOS transistor 2111 are coupled in series between the supply voltage VDD and ground. The gate of the PMOS transistor 2110 is biased by the first data node 219. The common node formed of the drain of the PMOS transistor 2110 and the drain of the NMOS transistor 2111 is coupled to the second data node 224.

FIG. 2J is a block diagram illustrating the wide output gain stage 210 according to a fourth alternate embodiment. This embodiment is similar to the embodiment shown in FIG. 2G with an additional stage. A PMOS transistor 2116 and a diode connected NMOS transistor 2117 are coupled between the voltage supply VDD and ground. A gate of the PMOS transistor 2116 is biased by the first data node 219. The common node formed of the drains of the PMOS transistor 2116 and the NMOS transistor 2117 is coupled to the gate of an NMOS transistor 2118. A resistor 2119 and the NMOS transistor 2118 are coupled in series between voltage supply VDD and ground. The drain of the NMOS transistor 2118 is coupled to the second data node 224. The embodiment of FIG. 2J is a VDD referred resistor based circuit.

Refer again to FIGS. 2A and 2B. In one embodiment, the input stage 202 does not include a wide output gain stage 210.

The low impedance output stage 211 comprises a plurality of NZ NMOS transistors 231 and 232 and an NMOS transistor 233. The drain-source terminals of the NZ NMOS transistors 231 and 232 and the NMOS transistor 233 are coupled in series between the supply voltage VDD and ground. The NMOS transistors 232 and 233 operate as a current load. The NZ NMOS transistor 231 is arranged as a source follower of the second data node (DAT1) 227 to couple the source of the NZ NMOS transistor 231 to an output node (DAT) 234, and for high speed driving and for buffering against the back coupling from the load. The size and bias current of the NZ NMOS transistor 231 determines the impedance. The low impedance output stage 211 has an output impedance that is independent of the cell current. In a conventional sense amplifier, the load also acts the output stage, which has the disadvantage that the impedance is dependent on the cell current. In a multilevel cell, the cell current operates in as a wide of a sensing range as possible, e.g., from high to very low current level. At low current level, the impedance is high in a conventional sense amplifier.

FIG. 2K is a block diagram illustrating the low impedance output stage 211 according to a first alternate embodiment. An operational amplifier 2122 has a first input coupled to the second data node 227 and has an output coupled to the output data node 234. Variable resistors 2123 and 2124 are coupled in series between the output of the operational amplifier 2122 and ground. The common node formed between the variable resistors 2123 and 2124 is fed back to a second input of the operational amplifier 2122.

FIG. 2L is a block diagram illustrating the low impedance output stage 211 according to a second embodiment. A current source 2130 is coupled between the supply voltage VDD and the output data node 234. A PMOS transistor 2131 is coupled between the data node 234 and ground and the gate is biased by the second data node 227.

Refer again to FIGS. 2A and 2B. The bias generator 203 generates bias for the circuits 202, 204, 205, and 206. The bias generator 203 comprises a plurality of PMOS transistors 235 through 240, a plurality of NMOS transistors 241 through 244, and a plurality of inverters 245 and 246.

The drain-source terminals of the PMOS transistors 236 and 237 and the NMOS transistor 241 are coupled in series between the supply voltage VDD and ground. The diode connected PMOS transistor 236 generates a bias voltage (VBP) 247 to bias PMOS transistors in the circuits 202, 204, 205, and 206. The gate of the PMOS transistor 237 is controlled by the inverter 245 which inverts an enable sense amp bias (SABIASEN) signal 250. The PMOS transistor 235 pulls up the bias voltage (VBP) 247 to the supply voltage VDD.

The drain-source terminals of the PMOS transistors 238 and 239 and the NMOS transistor 242 are coupled in series between the supply voltage VDD and ground. The drain-source terminals of the PMOS transistor 240 and the NMOS transistor 243 are coupled in series between the drain of the PMOS transistor 238 and ground. The PMOS transistor 239 and the NMOS transistor 243 are diode connected. The drain-source terminals of the NMOS transistor 244 couple the drain of the PMOS transistor 240 to ground. The drain of the PMOS transistor 240 generates a bias voltage (VBN) 248 to bias NMOS transistors in the circuits 202, 204, 205, and 206. The NMOS transistors 241 and 242 are controlled by a sense amp bias (SABIAS) signal 249. The NMOS transistor 244 disables the bias voltage (VBN) 248 to ground in response to an inverted signal from the inverter 245, which inverts the enable sense amp bias (SABIASEN) signal 250. The inverter 246 inverts the enable sense amp (SAEB) signal 220 to form an inverted sense amp enable signal 282 for application to the differential comparator circuit 206.

The feedback cascoding circuit 204 comprises a plurality of PMOS transistors 251 and 252, an NH NMOS transistor 253, and a plurality of NMOS transistors 254 through 258.

The feedback cascoding circuit 204 controls the reading of the data memory cells 116 by controlling the coupling of an input/output (10) line 259 (which is coupled to the bit line 124) to the first data node (DAT0) 219. The NH NMOS transistor 253 is a cascode transistor. The NH NMOS transistor 253 includes drain-source terminals coupled between the first data node (DAT0) 219 and the input/output (IO) line 259, and includes a gate biased by a bias voltage (VGB) node 260.

The PMOS transistors 251 and 252 and the NMOS transistor 254 are coupled in series to form a feedback circuit for the cascode function. The drain of the PMOS transistor 252 forms the bias voltage (VGB) node 260. The NMOS transistor 254 with the current from the PMOS transistor 251 clamps the input/output line 259 at a bias voltage. The diode connected NMOS transistors 255 and 256 are coupled between the bias voltage node (VGD) 260 and ground to dampen the voltage on the bias voltage node (VGB) 260. The NMOS transistors 255 and 256 are sized proportionately to the NMOS transistors 253 and 254, respectively. The NMOS transistor 258 disables the bias voltage node (VGB) 260 to ground in a disable state in response to the enable sense amplifier (SAEB) signal 220. The NMOS transistor 257 disables the input/output line 259 to ground in a disable state in response to the enable sense amplifier (SAEB) signal 220. In one embodiment, the NMOS transistor 257 is disconnected from the input/output line 259 to not ground it in a disable state.

The cascode device formed of the NMOS transistor 253 is described for an N-type NMOS transistor, but the NMOS transistor 253 may be an NZ NMOS transistor.

In one embodiment, the feedback circuit is a common source amplifier with a current load. In another embodiment, the feedback circuit is a common source amplifier with a PMOS transistor in saturation or operating in a linear mode.

In an alternate embodiment, a fixed bias voltage is applied to the gate of the cascading device (NMOS transistor 253).

The pre-charge circuit 205 comprises a plurality of PMOS transistors 261 through 264, an NZ NMOS transistor 265, a plurality of NMOS transistors 266 through 268, and a capacitor 269. The NZ NMOS transistor 265 may be implemented as an N NMOS transistor.

The pre-charge circuit 205 increases the speed of sensing by the input stage 202 by precharging the voltage on the input/output line 259. The PMOS transistor 263 and the NMOS transistor 268 precharge the input/output line 259 and are coupled between the supply voltage VDD and the input/output (IO) line 259. The NMOS transistor 268 precharges the input/output line 259. The gate of the PMOS transistor 263 is enabled by a precharge (SAPREB) signal 270. The gate of the NMOS transistor 268 is biased by a bias voltage (VGB2) node 271. The PMOS transistor 263 enables the NMOS transistor 268.

The PMOS transistors 261 and 262 and the NMOS transistors 266 and 267 generate a replica bias level on the input/output line 259 to replicate the bias on the NH NMOS transistor 253. The PMOS transistors 261 and 262 and the diode connected NMOS transistors 266 and 267 are coupled in series between the supply voltage VDD and ground. The drain of the PMOS transistor 262 forms the bias voltage (VGB2) node 271. The gate of the PMOS transistor 261 is biased by the bias voltage (VBP) 248. The gate of the PMOS transistor 262 is enabled by the inversion of the enable sense amp bias (SABIASEN) signal 250. The NMOS transistors 267 and 266 are sized in proportion to the NMOS transistors 254 and 253, respectively.

The pre-charge circuit 205 also precharges the output data (DAT) node 234. The NZ NMOS transistor 265 precharges the output data node (DAT) 234 to at least the lowest reference level (REF3) 130-3. The PMOS transistor 264 enables the NZ NMOS transistor 265. The PMOS transistor 264 and the NZ NMOS transistor 265 are coupled in series between the supply voltage VDD and the output data node (DAT) 234. The gate of the PMOS transistor 264 is biased by the precharge (SAPREB) signal 270. The gate of the NZ NMOS transistor 265 is biased by the reference level (REF3) 130-3.

In one embodiment, the precharge (SAPREB) signal 270 may be a pulsing signal.

FIG. 2M is a block diagram illustrating a precharge circuit 205 in accordance with another embodiment. A current source 2140 and a plurality of diode connected NMOS transistors 2141, 2142 and 2143 are coupled in series between the supply voltage VDD and ground. The common node formed of the current source 2140 and the drain of the NMOS transistor 2141 are coupled to the gate of the NMOS transistor 268 for biasing the NMOS transistor 268 for selecting the precharge of the bias voltage node VGB 260.

In one embodiment, the sense amplifier 116 does not include a pre-charge circuit 205.

The differential comparator circuit 206 comprises differential amplifiers 272-1 through 272-3 and an equalization circuit 273.

The differential amplifiers 272-1 through 272-3 compare the data cell 116 as indicated on the output data node (DAT) 234 to three reference cells 120 to generate an output signal (S1, S2, S3) 283 and an inverted output signal (S1B, S2B, S3B) 284. The decoder circuit 208 decodes the output signals 283 into two digital bits. (For clarity, the signals 283 and 284 are labeled only for the differential amplifier 272-1.). In other embodiments, other numbers of differential amplifiers 272 may be used to decode other numbers of bits.

The equalization circuit 273 comprises a plurality of inverters 274 through 278 coupled in series.

The equalization circuit 273 generates equalization signals for controlling the equalization of the outputs 283 and 284 of the differential amplifiers 272. The inverter 274 generates an inverted equalization (EQB) signal 279 in response to an equalization (EQ) signal 285. The inverter 275 generates an equalization signal (EQ) 280. The inverter chain formed of the inverters 276, 277, and 278 generate a delayed equalization (EQBDLY) signal 281.

The enable sense amp bias signal (SABIASEN) 250 and an inverted sense amp enable signal 282 from the inverter 246, which inverts the enable sense amplifier signal (SAEB) 220 are applied to the differential amplifiers 272.

Figure 3:
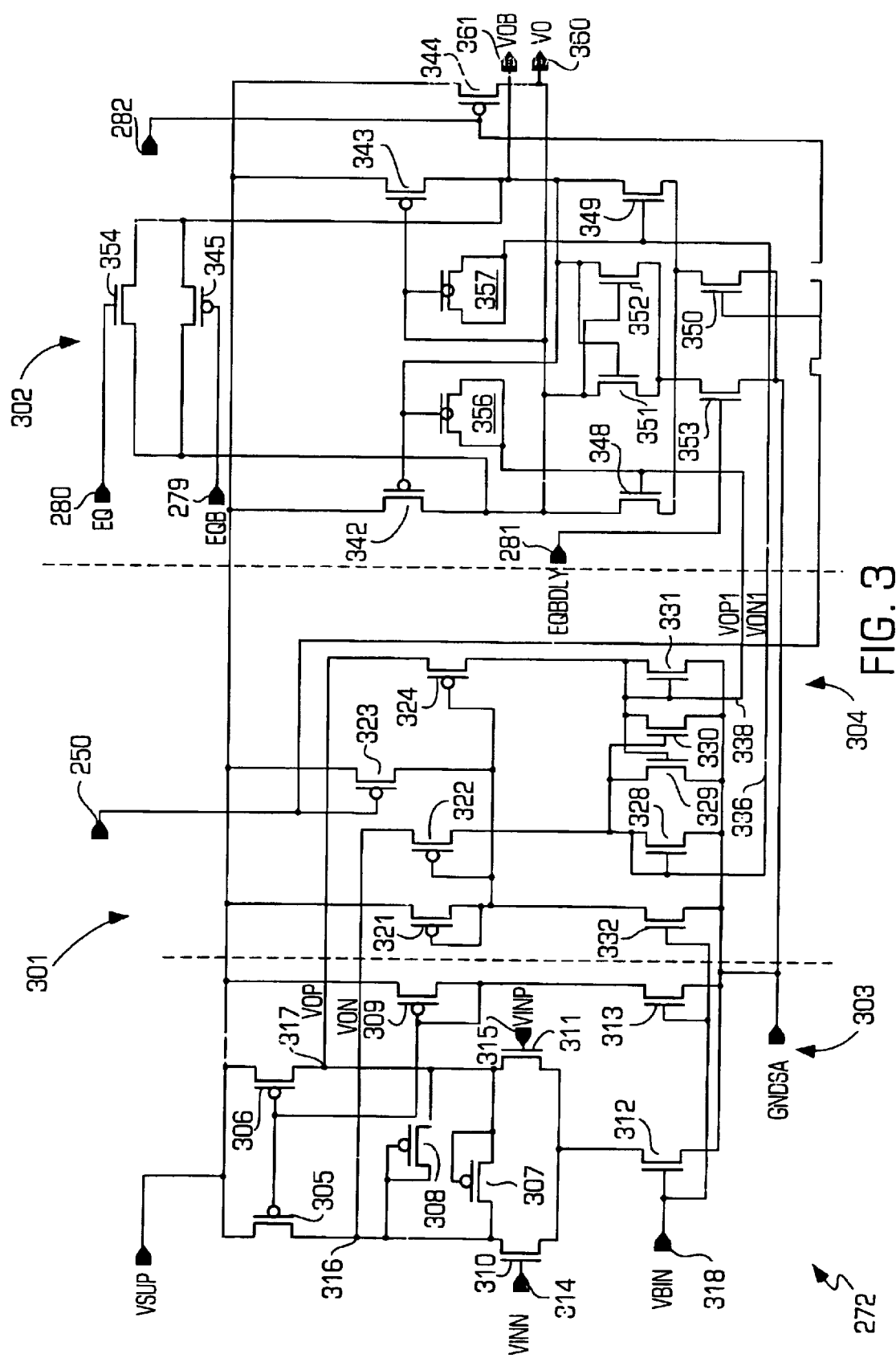
FIG. 3 is a block diagram illustrating a differential amplifier of the sense amplifier of FIG. 2.

FIG. 3 is a block diagram illustrating the differential amplifier 272.

The differential amplifier 272 comprises a preamplifier stage 301 and a latch analog bootstrap amplifier stage 302.

The preamplifier stage 301 comprises an input differential stage 303 and a preamplifier output stage 304. In one embodiment, the preamplifier stage 301 provides a high input common mode range.

The input differential stage 303 provides a down output voltage (VON) 316 and an up output voltage (VOP) 317 in response to a down input voltage (VINN) 314 and an up input voltage (VINP) 315. The down input voltage (Vex) 314 corresponds to the output data (DAT) node 234 coupled to the differential amplifier 272 (see FIG. 2).

The input differential stage 303 comprises a plurality of PMOS transistors 305 through 309 and a plurality of NMOS transistors 310 through 313. The PMOS transistors 305 and 306 and the NMOS transistors 310, 311, and 312 are arranged as a differential amplifier. The down input voltage (VINN) 314 and the up input voltage (VINP) 315 are applied to the gates of the NMOS transistors 310 and 311, respectively. In another embodiment, the NMOS transistors 310 and 311 are NZ NMOS transistors, to thereby provide a wide common mode input range with respect to ground. The NMOS transistor 312 provides a current bias in response to a bias voltage (VBN) 318. The diode-connected PMOS transistors 307 and 308 each are coupled between the up output voltage node (VOP) 317 and the down output voltage node (VON) 316 in opposite polarity directions to clamp the voltages on the nodes 316 and 317. The diode-connected PMOS transistor 309 and the NMOS transistor 313 are coupled in series between the supply voltage VDD and ground. The drain of the PMOS transistor 309 is coupled to the common node formed of the gates of the PMOS transistors 305 and 306 to bias the PMOS transistors 305 and 306. The PMOS transistors 305 and 306 may have a minimum voltage across its drain to source to remain in saturation, thereby providing a high common mode input range with respect to high supply voltage. The NMOS transistor 313 is biased by the bias voltage (VBN) 318.

The preamplifier output stage 304 comprises a plurality of PMOS transistors 321 through 324 and a plurality of NMOS transistors 328 through 332.

The PMOS transistor 322 and the diode connected NMOS transistor 328 are coupled in series between the down output voltage (VON) 316 and ground to provide a down output voltage (VON1) 336 from the drain of the PMOS transistor 322. Likewise, the PMOS transistor 324 and the diode connected NMOS transistor 331 are coupled in series between the up output voltage (VOP) 317 and ground to provide an up output voltage (VOP1) 338 from the drain of the PMOS transistor 324. The diode-connected PMOS transistor 321 and the NMOS transistor 332 are coupled in series between the supply voltage VDD and ground to provide a bias voltage on the drain of the PMOS transistor 321 to bias the gates of the PMOS transistors 322 and 324.

The NMOS transistors 329 and 330 provide gain enhancement. The NMOS transistor 329 couples the down output voltage (VON1) 336 to ground in response to biasing by the up output voltage (VOP1) 338. The NMOS transistor 330 couples the up output voltage (VOP1) 338 to ground in response to biasing by the down output voltage (VON1) 336. The PMOS transistor 323 disables the gates of the PMOS transistors 321, 322, and 324 to the supply voltage VDD in a disable state in response to the enable sense amp bias (SABIASEN) signal 250.

The latch analog bootstrap amplifier stage 302 comprises a plurality of PMOS transistors 342 through 345, a plurality of NMOS transistors 348 through 354, and a plurality of capacitors 356 and 357.

The latch analog bootstrap amplifier stage 302 provides output voltages on an output voltage (VO) node 360 and an inverted output voltage (VOB) node 361 depending on the comparison between the read data from the data memory cells 116 applied to the down input voltage (VINN) 314 and a local reference voltage 130 applied to the up input voltage (VINP) 315.

The PMOS transistors 342 and 343 and the NMOS transistors 348 and 349 are arranged as a latch to provide the initial latching. The PMOS transistor 342 pulls up the output voltage (VO) node 360 to the supply voltage VDD in response to the inverted output voltage (VOB) node 361. The PMOS transistor 343 pulls up the inverted output voltage (VOB) node 361 to the supply voltage VDD in response to the output voltage (VO) node 360. The NMOS transistors 348 and 349 pull down the respective output voltage (VO) node 360 and the inverted output voltage (VOB) node 361 to ground through the NMOS transistor 350 in response to the up output voltage (VOP1) 338 and the down output voltage (VON1) 336, respectively.

The capacitors 356 and 357 provide an analog bootstrap in a positive feedback configuration after equalization of the voltage on the nodes 360 and 361. The capacitors 356 and 357 speed up the initial sensing time of the latch formed of the PMOS transistors 342 and 343 and the NMOS transistors 348 and 349. The capacitor 356 couples the up output voltage (VOP1) 338 to the common node formed of the gate of the PMOS transistor 342 and the inverted output voltage node (VOB) 361. The capacitor 357 couples the down output voltage (VON1) 336 to the common node formed of the gate of the PMOS transistor 343 and the output voltage node (VO) 360. As the voltage on the up output voltage (VOP1) 338 or the down output voltage (VON1) 336 rises, the respective capacitor 356 or 357 raises the voltage on the respective output voltage node 361 or 360.

The NMOS transistors 351, 352, and 353 provide post latching amplification. In one embodiment, the post latching amplification includes a delay after the equalization is released. The NMOS transistors 351 and 352 are coupled between the output nodes 360 and 361, respectively, and the drain of the NMOS transistor 353 to increase the speed of the pull down of the output voltage nodes 360 and 361, respectively in response to the inverted output voltage node (VOB) 361 and the output voltage node (VO) 360, respectively. The NMOS transistor 353 couples the sources of the NMOS transistors 351 and 352 to ground in response to the delayed equalization (EQBDLY) signal 281.

The PMOS transistor 345 and the NMOS transistor 354 provide equalization of the inverted output voltage node (VOB) 361 and the output voltage node (VO) 360. The PMOS transistor 345 and the NMOS transistor 354 are coupled between the inverted output voltage node (VOB) 361 and the output voltage node (VO) 360 to equalize the voltage thereon in response to an inverted equalization signal (EOB) 279 and an equalization signal (EO) 280, respectively. Because the delayed equalization (EQBDLY) signal 281 changes state after the equalization signal (EQ) 280, the post-latching amplification is delayed after the equalization is released.

The PMOS transistor 344 provides a reset state on the output voltage node (VO) 360 by coupling the node 360 to the supply voltage VSUP in a disable state in response to the inverted sense amp enable signal 282 (see FIG. 2A).

The preamplifier output stage 304 isolates the full swing of the output voltages 360 and 361 from the input voltages 314 and 315 to minimize kickback in the differential amplifier 272.

Because the preamplifier stage 301 includes a folded cascode structure and the amplifier stage 304 is a single stage amplifier, a lower supply voltage VDD may be used.

Refer again to FIGS. 2A and 2B. The latch circuit 207 latches the data output from the differential amplifiers 272.

The latch circuit 207 comprises a plurality of latches 290-1 through 290-3, and an inverter 291. Each latch 290 comprises a plurality of PMOS transistors 2001 through 2003, a plurality of NMOS transistors 2004 through 2007, a plurality of inverters 2008 and 2009, and a transfer gate 2010. (For clarity, only elements of the latch 290-1 are labeled with reference numbers.) The inverter 291 inverts a latch signal 2012 to provide an inverted latch signal 2013.

The PMOS transistors 2001 and 2002 and the NMOS transistors 2004 and 2005 are coupled between the supply voltage VDD and ground to form a tri-state inverter that can be enabled or disabled. The PMOS transistor 2002 and the NMOS transistor 2004 are enabled by the inverted latch signal 2013 and the latch signal 2012, respectively. The output voltage node (VO) 283 from the differential amplifier 272 is applied to the gates of the PMOS transistor 2001 and the NMOS transistor 2005 through the transfer gate 2010, which also in enabled by the latch signal 2012 and the inverted latch signal 2013. An inverted data output (Q1B) node 2014 formed of the drains of the PMOS transistor 2002 and the NMOS transistor 2004 generates an inverted signal of the output voltage 283 from the differential amplifier 272, and applies the inverted signal to a latch formed of the inverters 2008 and 2009, which are cross coupled. The PMOS transistor 2003 and the NMOS transistor 2006 are arranged as an inverter to generate a data output (Q1) signal 2015-1. (The latches 290-2 and 290-3 generate a data output (Q2) signal 2015-2 and a data output (Q3) signal 2015-3, respectively.) The latch formed of the inverters 2008 and 2009 latches the inverted data output (Q1B) signal 2014. The NMOS transistor 2007 sets the latch formed of the inverters 2008 and 2009 to a low state on the inverted data output (Q1B) node 2014 in response to a clear sense amplifier (CLRSA) signal 2016.

The decoder circuit 208 decodes the outputs of the three differential amplifiers 272, which represent the comparison of the read cell to the three reference levels 130 into two digital bits. As noted above, other numbers of differential amplifiers 272 may be used for decoding into other numbers of digital bits.

The decoder circuit 208 comprises a plurality of NAND gates 2030 through 2033, a plurality of NOR gates 2036 through 2038, a plurality of inverters 2040 through 2045, and a plurality of transfer gates 2048 through 2051.

The NAND 2032 and 2033, the NOR gates 2037, 2038 and the inverters 2042, 2043, and 2044 form the decode logic for the output of the latch circuit 207. The data output (Qx) nodes 2015-1 through 2015-3 are applied to an AND gate formed of the NAND gate 2033 and the inverter 2043, and also applied to the NOR gate 2037. The NOR gate 2038 and the inverter 2044 form an OR gate that receives the outputs of the inverter 2043 and the NOR gate 2037, and generates an output which is applied to the transfer gate 2051. The data output nodes 2015-2 and 2015-3 are applied to the AND gate formed of the NAND 2032 and the inverter 2042, and generates an output which is applied to the transfer gate 2049.

A read sense amplifier (RSA) signal 2054-0 (from FIGS. 4A and 4B) is applied to the transfer gate 2048. A read sense amplifier (RSA) signal 20541 (from FIGS. 4A and 4B) is applied to the transfer gate 2050. The selection of one of the transfer gates 2050, 2051 and one of the transfer gates 2048, 2049 depends on whether a redundant or reference cell is being read.

The NAND gates 2030 and 2031, the NOR gate 2036, and the inverter 2040 form the decode logic for the output of the redundant or reference cells. Redundancy data output (R1, R2) signals 2051-1 and 2050-2 are applied to the NAND gate 2030. A redundancy data output (R0) 2052-0 and a redundancy enable (REDEN) signal 2053 are applied to the NAND gate 2031. The output of the NAND gates 2030 and 2031 are applied to the NOR gate 2036, which is inverted by the inverter 2040, and the outputs provided to the transfer gates 2048 and 2049 for selecting the transfer gates 2048 and 2049. The output of the NOR gate 2036 and the inverter 2040 are applied to the transfer gates 2048 through 2051 to select between output and the read sense amplifier signal 2054 and the decoded signals from the inverters 2042 and 2044. The output of the selected transfer gate 2048 and 2049 is applied to the inverter 2041 and provided as a first bit of the sense amp output 2055. The selected output from the transfer gates 2050 and 2051 is applied to the inverter 2045 and provided as the second bit of the sense amp output 2055.

In one embodiment, a serial comparison for the verify operation of the local reference programming is performed. One differential amplifier 272 is used and the verification is performed by serially changing the reference levels applied to the differential amplifier 272 instead of the parallel comparison by the multiple differential amplifiers 272. Using one differential amplifier 272, introduces the same comparison offset for each reference level. Hence the distance between the levels is not effected by the comparison offset.

In one embodiment, a serial comparison for the verify operation of the data programming is performed in a manner similar to the serial comparison for the verify operation of the local reference programming.

Because the sense amplifier 117 is disposed adjacent the memory array 102, the memory 100 is segmented. The sense amplifier 117 is coupled to a reduced capacitance of the bit line 124 because of the segmentation. The high speed load stage 209 may be faster and the gain of the gain stage 210 may be lower.

Figure 4A:
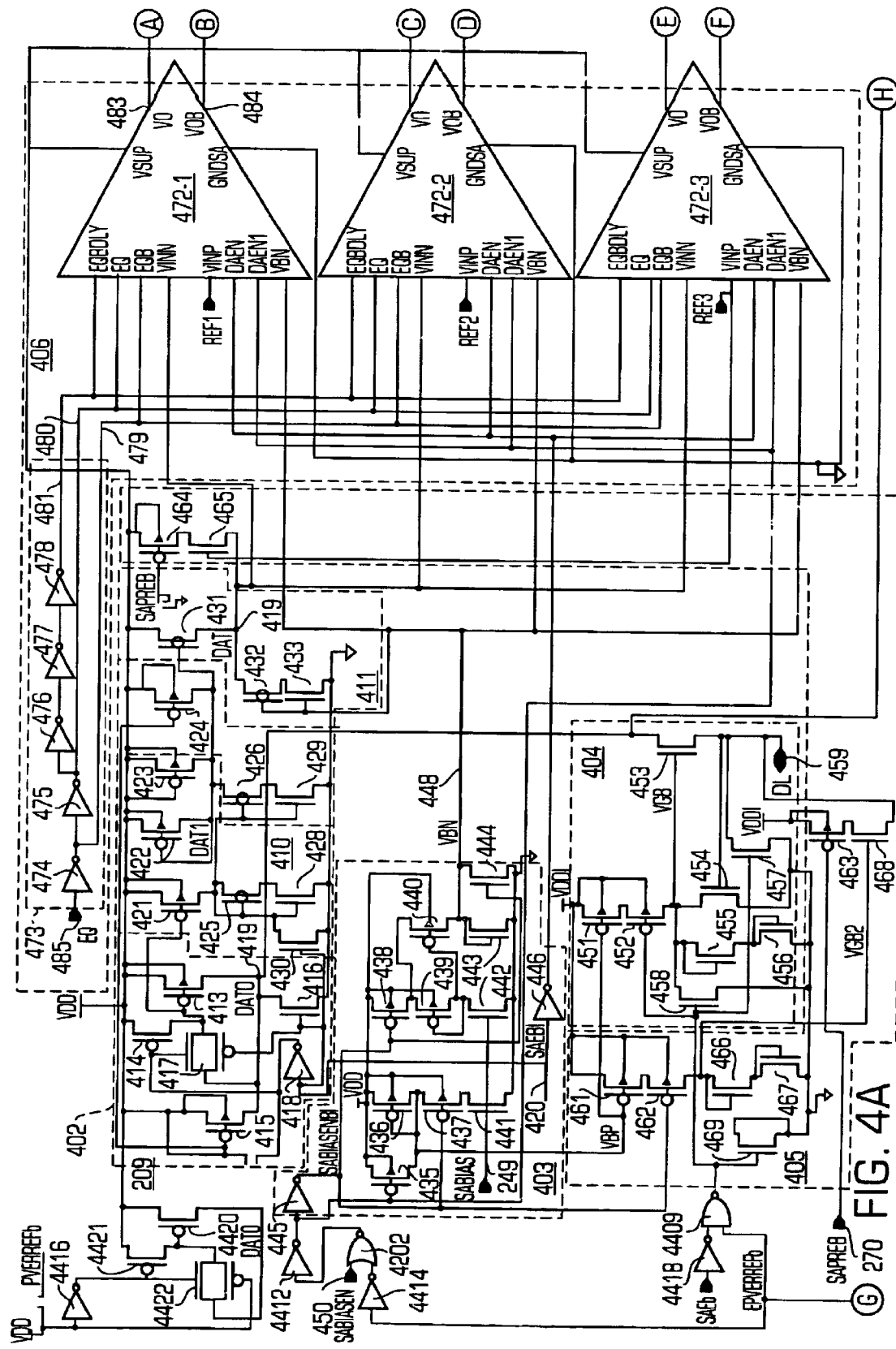
FIGS. 4A and 4B are block diagrams illustrating a reference sense amplifier of the non-volatile multilevel memory system of FIG. 1.
Figure 4B:
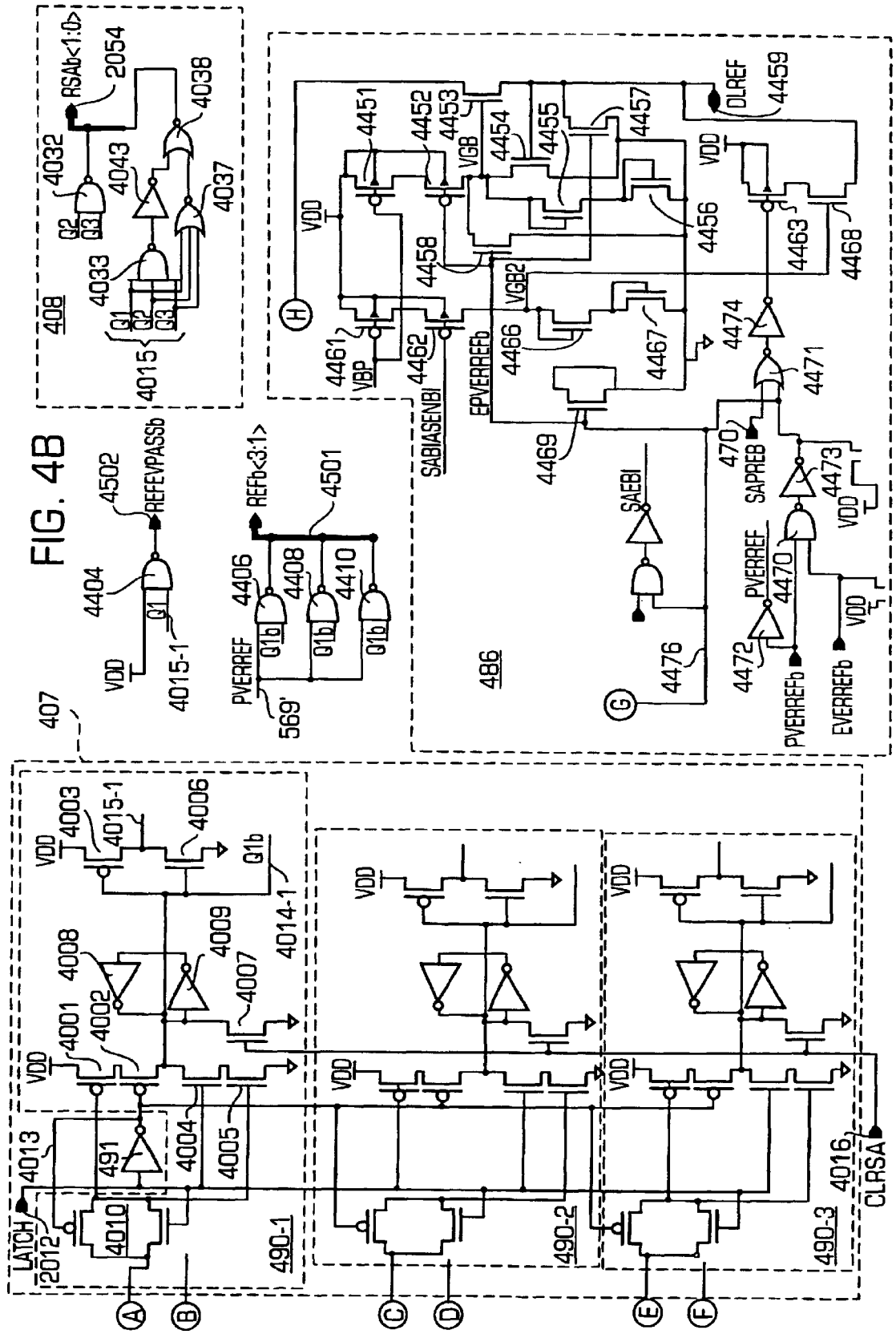

FIGS. 4A and 4B are block diagrams illustrating the reference sense amplifier 118.

In one embodiment, the reference sense amplifier 118 is similar to the data sense amplifier 117 to duplicate any offset.

The reference sense amplifier 118 comprises an input stage 402, feedback cascoding circuit 404, a pre-charge circuit 405, a differential comparator circuit 406, a latch circuit 407, a decoder circuit 408, and a feedback cascode and precharge circuit 486.

The reference sense amplifier 118 may also be used to sense the redundant data from the redundant cells. In one embodiment, the reference sense amplifier 119 includes a multiplexer for multiplexing the sense data from the redundant cells and the sense data from the reference cells to a common input stage 402.

The input stage 402 comprises a high speed load stage 409, a wide output gain stage 410, a low impedance output stage 411. The high speed load stage 409 is similar to the high speed load stage 209 (see FIG. 2A) and comprises a plurality of PMOS transistors 413, 414 and 415, a NMOS transistor 416, a multiplexer 417, and an inverter 418 arranged in a manner similar to the respective elements 213, 214, 215, 216, 217, and 218 of the high speed load stage 209. The wide output gain stage 410 is similar to the wide output gain stage 210 (see FIG. 2A) and comprises a plurality of PMOS transistors 421 through 424, a plurality of NZ NMOS transistors 425 and 426, and a plurality of NMOS transistors 428 through 430 arranged in a manner similar to the respective elements 221 through 226 and 228 through 230 of the wide output gain stage 210. The low impedance output stage 411 is similar to the low impedance output stage 211 (see FIG. 2B) and comprises a plurality of NZ NMOS transistors 431 and 432 and am NMOS transistor 433 arranged in a manner similar to the respective elements 231 through 233 of the low impedance output stage 211. The low impedance output stage 411 includes a first data DAT) node 419.

The bias generator 403 is similar to the bias generator 203 (see FIG. 2A). It comprises a plurality of PMOS transistors 435 through 440, a plurality of NMOS transistors 441 through 444, and a plurality of inverters 445 and 446 arranged in a manner similar to the respective elements 235 through 246 of the bias generator 203.

The feedback cascoding circuit 404 is similar to the feedback cascoding circuit 204 (see FIG. 2A) and comprises a plurality of PMOS transistors 451 and 452, and a plurality of NMOS transistors 453 through 458 arranged in a manner similar to the respective elements 251 through 258 of the feedback cascoding circuit 204. The NMOS transistor 453 couples an input/output line 459 to the first data node (DAT0) 419 in a manner similar to that described above in conjunction with FIG. 2A. The pre-charge circuit 405 is similar to the pre-charge circuit 205 (see FIG. 2A) and comprises a plurality of PMOS transistors 461 through 464, and a plurality of NMOS transistors 465 through 468, and a capacitor 469 arranged in a manner similar to the respective elements 261 through 269 of the pre-charge circuit 205. The pre-charge circuit 405 further comprises a capacitor 492 coupled between a sense amp enable (SAEBI) signal 420 and ground to hold the enable sense amp signal up during power down.

The reference sense amplifier 118 further comprises control logic formed of a NOR gate 4202, a plurality of NAND gates 4404, 4406, 4408, 4409, and 4410, a plurality of inverters 4412, 4414, 4416, and 4418, a plurality of PMOS transistors 4420 and 4421, and a transfer gate 4422. The NOR gate 4202 and the inverter 4412 form an OR gate to generate a bias enable signal for application to the inverter 445 and the differential amplifiers 472. A sense amplifier bias enable signal (SABIASEN) 450 is applied to a first input of the NOR gate 4202. The inverter 4414 applies to a second input of the NOR gate 4202 an enable signal, which is an inversion of an enable program reference verification (EPVERREFb) signal 4476 from the inverter 4473.

The PMOS transistors 4420 and 4421 and the transfer gate 4422 are arranged in a similar manner as the PMOS transistors 413 and 414 and the transfer gate 417. The inverter 4416 controls the biasing in response to the program reference verification signal. The ratio of the pull-up from the PMOS transistor 413 during program reference verification is enabled by the PMOS transistor 4420.

The NAND gate 4404 generates an erase reference verification (REFEVPASSb) signal 4502 in response to the data output signal 4015-1 from the latch 490-1 to indicate the result of a cell passing or failing an erase verification level. The NAND gates 4406, 4408 and 4410 generate a corresponding bit of a program reference verification (REFb) signal 4501 in response to the data output signals 4014-1 through 4014-3, respectively, and the reference program verify (PVERFER) signal 569' (see FIG. 5B) to indicate the results of a cell passing or failing a program reference verification level.

The NAND gate 4470 and the inverter 4473 generate the enable program verification reference verification signal 4476 to control the selection of either the feedback cascoding circuit 4404 or the feedback cascode and precharge circuit 486.

The differential comparator circuit 406 is similar to the differential comparator circuit 206 (see FIG. 2A), and comprises differential amplifiers 472-1 through 472-3 and an equalization circuit 473.

The differential amplifiers 472-1 through 472-3 compare the local reference cell 107 as indicated on the output data node (DAT) 419 to three global reference cells 128 to generate an output signal (S1, S2, S3) 483 and an inverted output signal (S1B, S2B, S3B) 484. The differential amplifiers 472-1 through 472-3 also similarly compare the redundant cell 120 to the local reference cell 107. The decoder circuit 408 decodes the output signals 483 into two digital bits. (For clarity, the signals 483 and 484 are labeled only for the differential amplifier 472-1.). In other embodiments, other numbers of differential amplifiers 472 may be used to decode other numbers of bits.

The latch circuit 407 is similar to the latch circuit 207 (see FIG. 2B) and comprises a plurality of latches 490-1 through 490-3, and an inverter 491 arranged in a manner similar to the respective elements 290 and 291 of the latch circuit 207. Each latch 490 comprises a plurality of PMOS transistors 4001 through 4003, a plurality of NMOS transistors 4004 through 4007, a plurality of inverters 4008 and 4009, and a transfer gate 4010. (For clarity only, elements of the latch 490-1 are labeled with reference numbers.) The latches 490-1 through 490-3 generate a data output (QX) signal 4015-1 through 4015-3 and an inverted data output (QXB) signal 4014-1 through 4014-3. The latches 490 are cleared by the clear sense amplifier (CLRSA) signal 4016.

The decoder circuit 408 is similar to the decoder circuit 208 (FIG. 2B) and comprises a NAND gate 4032 and 4033, a plurality of NOR gates 4037 and 4038, and an inverter 4043 arranged in a similar manner to respective elements 2032, 2033, 2037, 2038 and 2043 of the decoder circuit 208. The decoder circuit 408 decodes the output 4015 into the redundancy sense amplifier (RSA) signals 2054, which are applied to the decoder circuit 208 (FIG. 2B).

The feedback cascode and precharge circuit 486 controls the multiplexing for the reference cell 107. In one embodiment, the feedback cascode and precharge circuit 486 is made similar to the feedback cascoding circuit 204 and the precharge circuit 205 instead of a pure CMOS multiplexed connection in the signal.

The feedback cascode and precharge circuit 486 is similar to the combination of the feedback cascading circuit 204 and the precharge circuit 205, except for the precharging by the transistors 464 and 465. The feedback cascode and precharge circuit 486 comprises a plurality of PMOS transistors 4451 and 4452, and a plurality of NMOS transistors 4453 through 4458 arranged in a manner similar to the respective elements 451 through 458 of the feedback cascading circuit 404. The feedback cascode and precharge circuit 486 provides a precharge of a reference data line (DLREF) 4459 coupled between the reference data cell 120 and the first data node 419. The feedback cascoding and precharge circuit 404 further comprises a plurality of PMOS transistors 4461 through 4463, a plurality of NMOS transistors 4466 through 4468, and a capacitor 4469 arranged in a manner similar to the respective elements 461 through 469 of the precharge circuit 405. The feedback cascode precharge circuit 486 also comprises a NAND gate 4470, a NOR gate 4471, and a plurality of inverters 4472 through 4474, which provides the control logic for enabling the feedback cascode by controlling the PMOS transistor 4452 and the NMOS transistors 4457 and 4458. The control logic also controls the precharge by controlling the enabling of the PMOS transistor 4463.

Figure 5A:
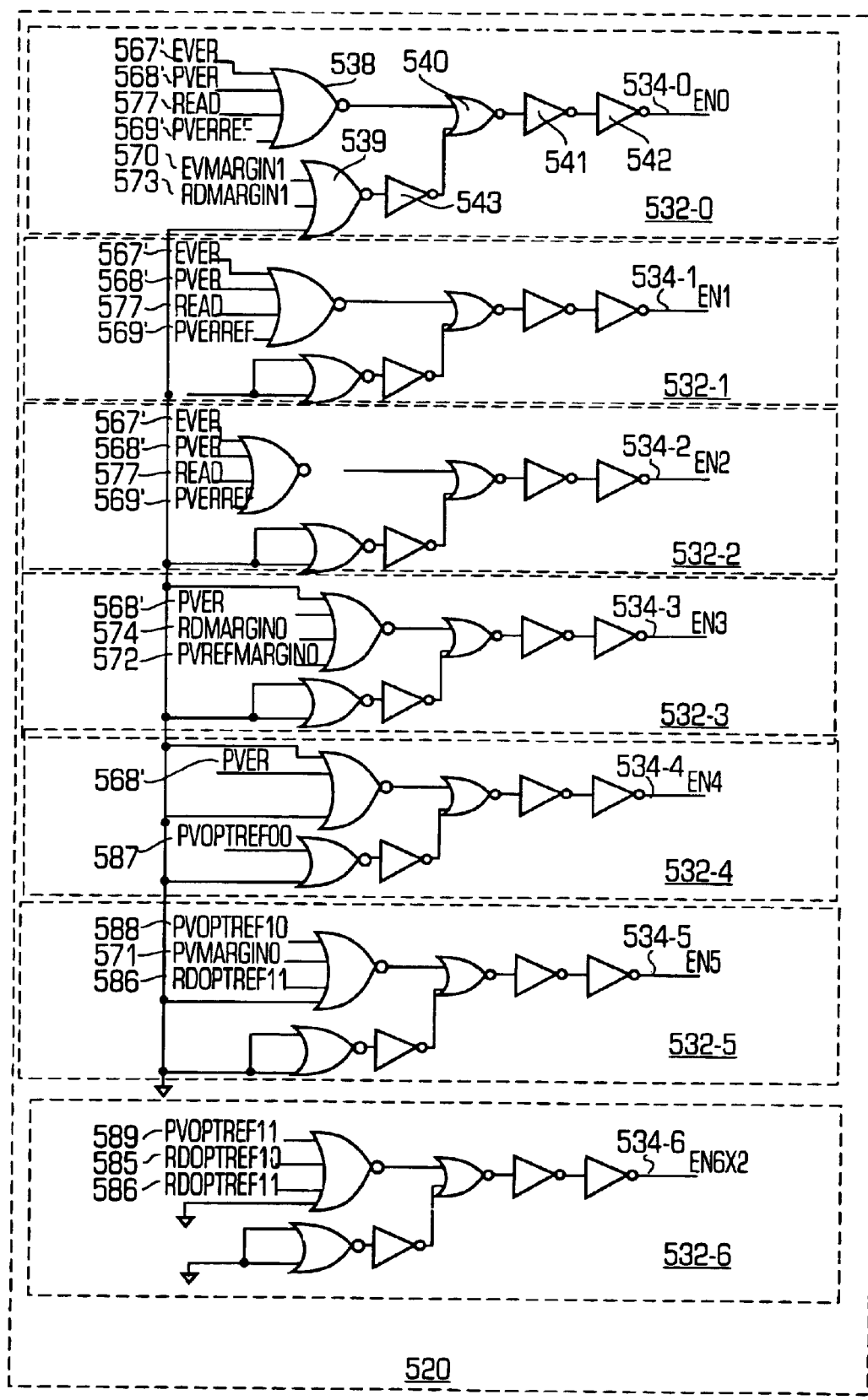
FIG. 5A, 5B and 5C are block diagrams illustrating a reference cascode pull-up driver of the non-volatile multilevel memory system of FIG. 1.
Figure 5B:
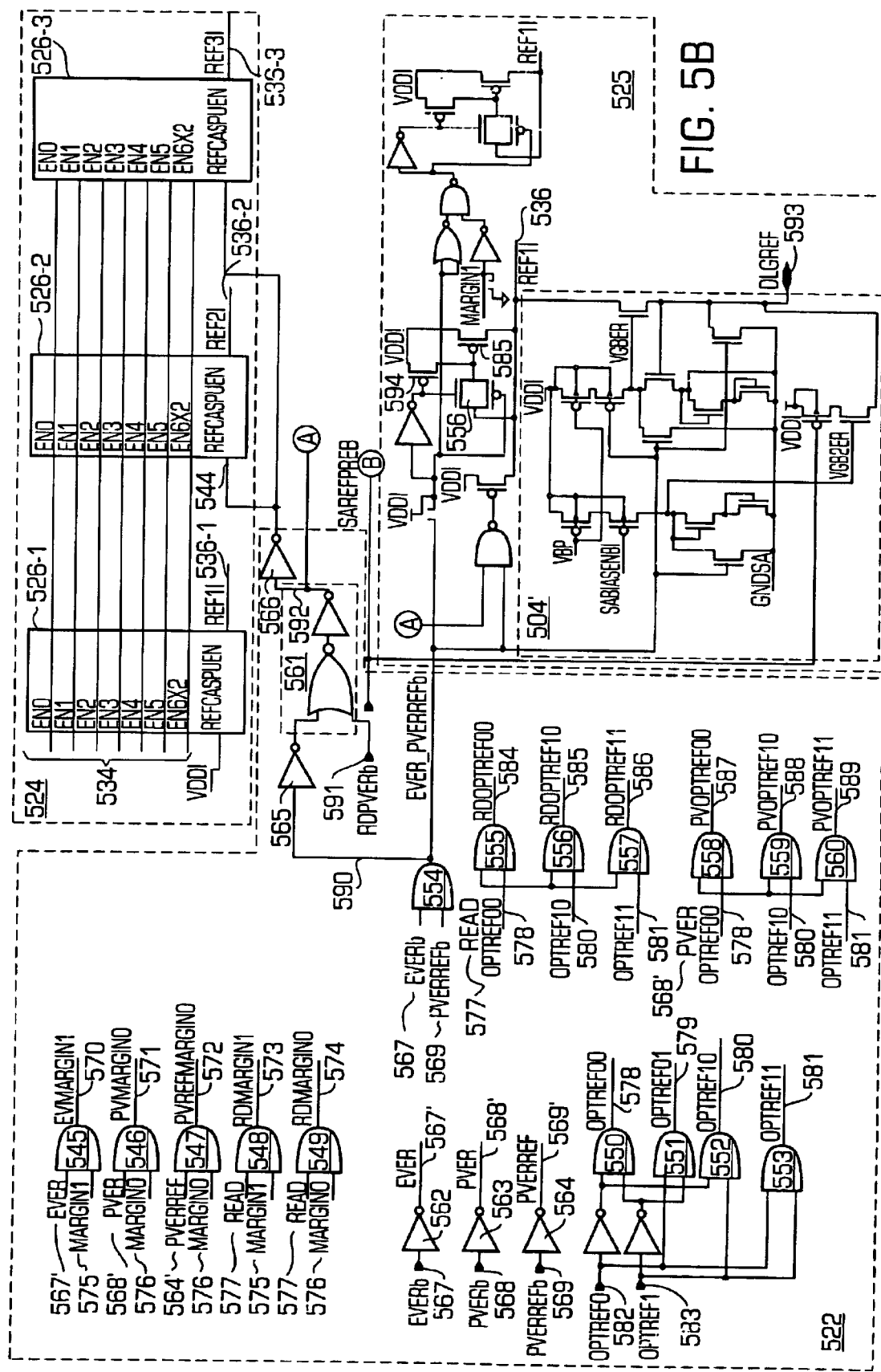
Figure 5C:
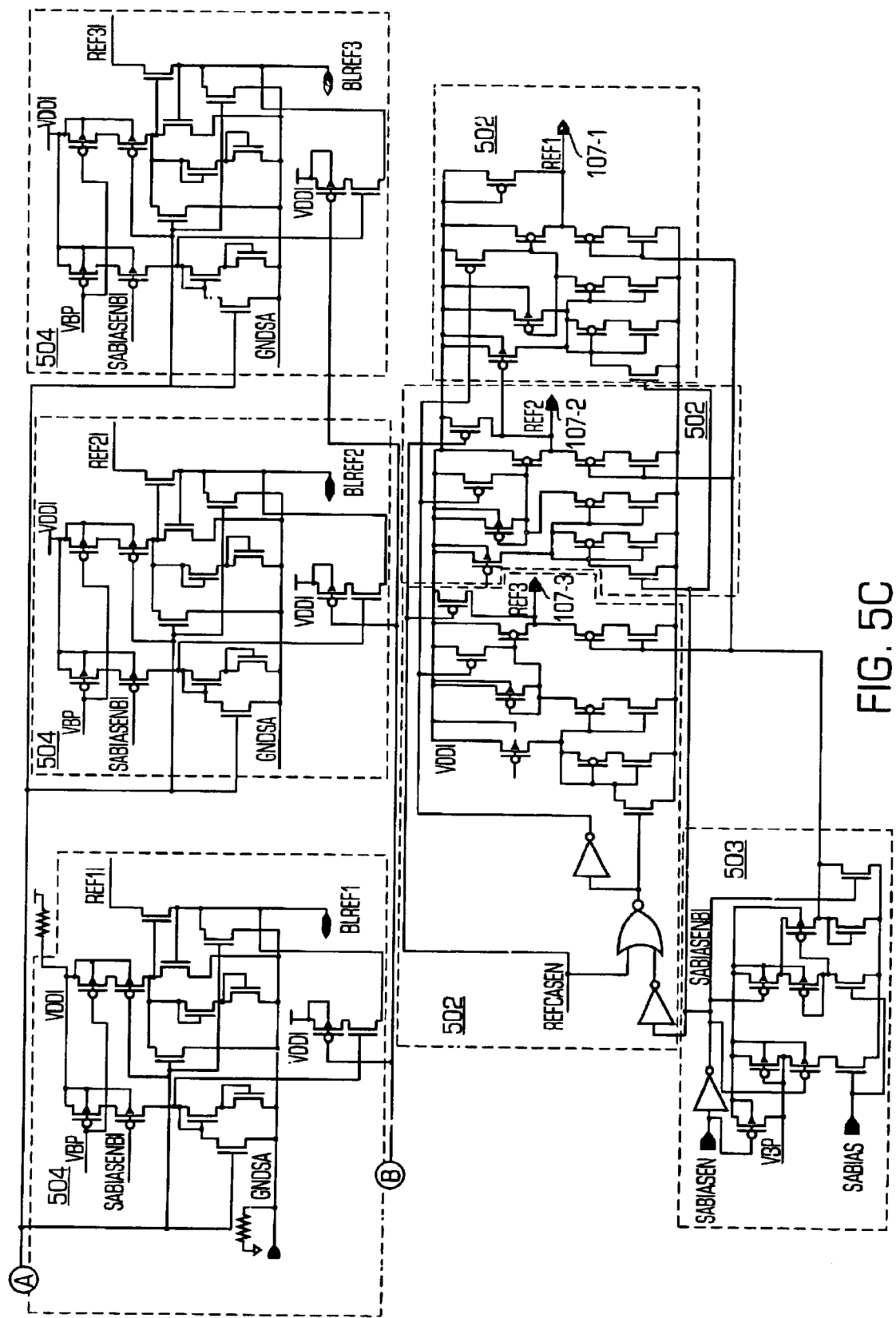

FIGS. 5A, 5B, and 5C are block diagrams illustrating the reference cascode pull-up driver 108.

The reference cascode pull-up driver includes three sets of similar circuits for driving the three local reference levels (REF1) 107-1, (REF2) 107-2 and (REF3) 107-3. In another embodiment, the numbers of similar circuits and the number of reference levels may be a number other than three.

The reference cascode pull-up driver 108 comprises a plurality of input stages 502, a plurality of bias generators 503, a plurality of feedback cascading and precharge circuits 504, a selection circuit 520, a logic enabler 522, a pull-up circuit 524, and a cascode circuit 525.

The reference cascoding and precharge circuit 504 is similar to the reference cascoding circuit 204 and the precharge circuit 205 of the data sense amp 117 of FIGS. 2A and 2B, except the circuit 504 lacks a counterpart of the precharge of the node 234 by the transistors 264 and 265. The reference cascoding and precharge circuit 504 also is similar to the feedback cascoding and precharge circuit 404 of FIG. 4A. The reference and cascode circuit 504 couples the bit line to reference lines (REF1I) 536-1, (REF2I) 536-2 and (REF3I) 536-3.

For clarity, the reference numbers of the input stage 502, bias generators 503, feedback cascading and precharge circuit 504 are not labeled.

The input stage 502 is similar to the input stage 202, except the input stage 502 lacks a counterpart of the load stage 209. The input stage 502 includes a low impedance stage that is sized up to drive heavy capacitance and a very noisy load. The sizing of this low impedance stage may be different from the sizing of the low impedance stage 211. In one embodiment, the sizing may be done such that the DC operating condition is the same, e.g., the sizing of the NMOS source follower (transistor 231) increases by the same factor as the bias current (transistors 232 and 233). The bias generator 503 provides bias for the input stage 502. The bias generator 503 is similar to the bias generator 203 (FIG. 2A).

The selection circuit 520 generates enable signals 534-0 through 534-6 for selecting the cascode ratio of the pull up circuit 524 for verification. The selection circuit 520 comprises a plurality of selections circuits 53240 through 532-6 for generating the enable (ENX) signals 534-0 through 534-6, respectively, for controlling the pull-up circuit 524.

Each selection circuit 532 comprises a plurality of NOR gates 538 through 540, and a plurality of inverters 541 through 543. (For clarity, only the reference numbers for the selection circuit 532-0 are shown) The NOR gate 540 and the inverters 541 and 542 form a NOR gate that NORs the outputs of the NOR gate 538 and the OR gate (formed of the NOR gate 539 and the inverter 543). All inputs of the NOR gate 539 are grounded for the circuits 532-1 through 532-6. The signals applied to the inputs of the selection circuits 532 are described below in conjunction with the logic enabler 522.

The logic enabler 522 provides the enable signals for the reference cascode pull-up driver 108. The logic enabler 522 comprises AND gates 545 through 560, an OR gate 561, and a plurality of inverters 562 through 566.

The inverter 562 generates an erase verify (EVER) signal 567' in response to an inverted erase verify (EVERb) signal 567. The inverter 563 generates a program verify (PVER) signal 568' in response to an inverted program verify (PVERb) signal 568. The inverter 564 generates a reference program verify (PVERFER) signal 569' in response to an inverted reference program verify (PVERFERb) signal 569.

The AND gate 545 generates a erase verify margin (EVMARGIN1) signal 570 in response to the erase verify (EVER) signal 567' and a first margin select (MARGIN1) signal 575. The AND gate 546 generates a program verify margin (PVMARGIN0) signal 571 in response to a program verify (PVER) signal 568' and a second margin select (MARGIN0) signal 576. The AND gate 547 generates a program reference margin (PVREFMARGIN0) signal 572 in response to a reference program verify (PVERREF) signal 569' and the second margin select (MARGIN0) signal 576. The AND gate 548 generates a read margin (RDMARGIN1) signal 573 in response to a read (READ) signal 577 and the first margin select (MARGIN1) signal 575. The AND gate 549 generates a read margin (RDMARGIN0) signal 574 in response to the read (READ) signal 577 and the second margin select (MARGIN0) signal 576.

The AND gate 550 generates an operational reference (OPTREF00) signal 578 in response to a complement of an operational reference (OPTREF0) signal 582 and a complement of an operational reference (OPTREF1) signal 583. The AND gate 551 generates an operational reference (OPTREF01) signal 579 in response to the operational reference (OPTREF0) signal 582 and the complement of an operational reference (OPTREF1) signal 583. The AND gate 552 generates an operational reference (OPTREF10) signal 580 in response to complement of an operational reference (OPTREF0) signal 582 and the operational reference (OPTREF1) signal 583. The AND gate 553 generates an operational reference (OPTREF11) signal 581 in response to the operational reference (OPTREF0) signal 582 and the operational reference (OPTREF1) signal 583.

The AND gate 555 generates a read operational reference (RDOPTREF00) signal 584 in response to the read (READ) signal 577 and the operational reference (OPTREF00) signal 578. The AND gate 556 generates a read operational reference (RDOPTREF10) signal 585 in response to the read (READ) signal 577 and the operational reference (OPTREF10) signal 580. The AND gate 557 generates a read operational reference (RDOPTREF11) signal 586 in response to read (READ) signal 577 and the operational reference (OPTREF11) signal 581. The AND gate 558 generates a program verify operational reference (PVOPTREF00) signal 587 in response to the program verify (PVER) signal 568' and the operational reference (OPTREF00) signal 578. The AND gate 559 generates a program verify operational reference (OPTREF11) signal 581 (PVOPTREF10) signal 588 in response to the program verify (PVER) signal 568' and the operational reference (OPTREF10) signal 580. The AND gate 560 generates a program verify operational reference (PVOPTREF11) signal 589 in response to the program verify (PVER) signal 568' and the operational reference (OPTREF11) signal 581.

The logic enable 522 enables the selection circuits 520 as follows. The signals 567', 568', 577, and 569' are applied to the NOR gate 538 of the selection circuit 532-0. The signals 570 and 573 are applied to the NOR gate 539 of the selection circuit 532-0. The signals 567', 568', 577, and 569' are applied to the NOR gate 538 of the selection circuit 532-1 and the selection circuit 532-2. The signals 568', 574, and 572 are applied to the NOR gate 538 of the selection circuit 532-3. The signal 568' is applied to the NOR gate 538 of the selection circuit 532-4. The signal 587 is applied to the NOR gate 539 of the selection circuit 532-4. The signals 588, 571, and 586 are applied to the NOR gate 538 of the selection circuit 532-5. The signals 589, 585, and 586 are applied to the NOR gate 538 of the selection circuit 532-6.

The AND gate 554 generates a erase and program verify reference (EVER_PVERREFb) signal 590 in response to the inverted erase verify (EVERb) signal 567 and inverted program verify (PVERREFb) signal 569. The OR gate 561 generates an enable signal 592 to enable the feedback cascode and precharge circuits 504 in response to a read program verify (RDPVERb) signal 591 and the inversion of the signal 590 from the inverter 565. The inverter 566 inverts the enable signal 592 to generate a reference cascode enable (REFCASEN) signal 544.

The pull up circuit 524 comprises three pull-up circuits 526-1 through 526-3. The pull-up circuit 524 adjusts the cascode ratio on the reference lines for margining. The reference cascode enable (REFCASEN) signal 544 is applied to the circuits 526-2 and 526-3.

FIG. 6 is a block diagram illustrating the pull-up circuit 526.

The pull-up circuit 526 comprises a plurality of pull-up stages 602-0 through 602-9, and a plurality of PMOS transistors 604 and 606. The pull-up stage 602-0 through 602-9 selectively pull up the voltage on a reference line (REF1) 607 to the supply voltage VDD. (The reference line 607 couples to the reference lines 536 of FIG. 5B.) In the embodiment shown in FIG. 6, the pull-up stages 602-8 through 602-10 are enabled constantly. However, various numbers of pull-up stages 602 may be set in a selective enable mode or in a constant enabled state.

In various embodiments of the pull-up circuits 602, the amount of the pull-up may be selected to have different values. By selecting different combinations of the values, different amounts of the pull-up may be selected.

Each pull up stage 602 comprises PMOS transistors 608 and 610, a transfer gate 612, and an inverter 614. (For clarity only reference numbers for the stage 620-6 are shown.) The PMOS transistor 608 couples the supply voltage VDD to the reference line (REF1) 607 to pull up the voltage on the reference line (REF1) 607. The PMOS transistor 610, the transfer gate 612 and the inverter 614 form an enable circuit to enable the PMOS transistor 608. The pull up stages 602-1 through 602-7 are controlled by an enable signal (ENX) 534. The PMOS transistor 608 of the pull up stages may be selected to have different ratios. By selecting different combinations of the pull up stages 602, different pull up is obtained.

The diode connected PMOS transistor 604 provides the main ratio of the pull-up, e.g., a ratio m=16. The PMOS transistor 606 disables the reference line 607 to the supply voltage VDD in response to an enable pull-up signal 618. For the pull-up circuit 526-1, the enable pull-up signal 618 may be the supply voltage VDD. For the pull-up circuits 526-2 and 526-3, the enable pull-up signal 618 may be coupled to an enable pull-up reference cascode (REFCASUPEN) signal 544 (see FIG. 5B).

The PMOS transistor 608 is selected for the stages 620 for a desired pull up ratio. In one embodiment, the stages 60240 through 602-5, 602-8, and 602-9 have a pull up ratio m=1, and the stages 602-6 and 602-7 have a pull up ratio m=2. This allows a number of different ratios to be selected. Other m factors may be used to realize more or other ratios. Further, transistor size difference may provide different ratios.

The ratio is used in program verify, erase verify, read margin, and production test to maintain certain margin for the normal operation.

In one embodiment, a different margin ratio may be used for each reference level to maintain different margins. For example, for a 2-bit multilevel cell, there are a possible four or three levels, resulting in a possible four or three set of margin ratios.

Refer again to FIG. 5B. The cascode circuit 525 comprises a feedback cascading and precharge circuit 504' (similar to the circuit 504) to multiplex the reference voltage from the global reference cells 106 on a line 593 to the reference lines 536 for verification.

The cascode circuit 525 also comprises an enable circuit comprising a plurality of PMOS transistors 594 and 595 and a transfer gate 596 to disable the line 593 in a manner similar to the PMOS transistors 213 and 214 and the transfer gate 217 of FIG. 2A.

FIG. 7 is a graph illustrating an IR drop along the sense amplifier 10.

A supply voltage line 702 indicates the voltage of the supply voltage VDD. A supply ground line 704 indicates the voltage of the ground. As shown in FIG. 1 for illustrative purposes, the sense amplifier voltage pad 112 is on the right side of FIG. 1 and the sense amplifier ground pad 114 is on the left side of FIG. 1.

In one embodiment, the same current flows in the supply voltage VDD and the ground. The connecting lines of the system 100 may be formed to duplicate the same resistance on the supply voltage VDD and ground, for example by metal lines and components with the same dimensions. The supply voltage line 702 and the supply line 704 have the same curvature, e.g., at any point along the memory array 102, the difference between the lines 702 and 704 remains constant.

In one embodiment as shown in FIG. 1, the reference sense amplifier 118 is position on the left and the sense amplifiers 117 are positioned on the right. The drop compensation is as follows: over temperature, the supply voltage VDD drop causes a different delta voltage due to the PMOS (the PMOS transistors 213 and 222 in FIG. 2B) between the reference and the data. The ground drop causes a complementary delta voltage applied to the current bias for the buffer stage in the sense amplifier 117 (FIGS. 2A and 2B). By sizing appropriately the current bias, the drop is compensated.

FIG. 8 is a graph illustrating an IR drop along a sense amplifier 110 including compensated currents.

A supply voltage line 802 indicates the voltages supplied voltage VDD. A supply ground line 804 indicates the voltage to the ground. The lines 802 and 804 are similar to the lines 702 and 704 described above. However, a plurality of compensation currents 806, 808, 810, and 812 may be selectively disposed in the circuit to adjust for the voltage drop. The compensation currents 806 and 810 may be injected from the supply voltage VDD or the compensation currents 808 and 812 may be reduced to the ground along the lines 802 and 804 to compensate for the drop. In one embodiment, a selective combination of the compensation currents 806, 808, 810, and 812 are currents proportional to temperature, and a selective combination of the compensation currents 806, 808, 810, and 812 are complementary currents proportional to temperature.

Figure 9:
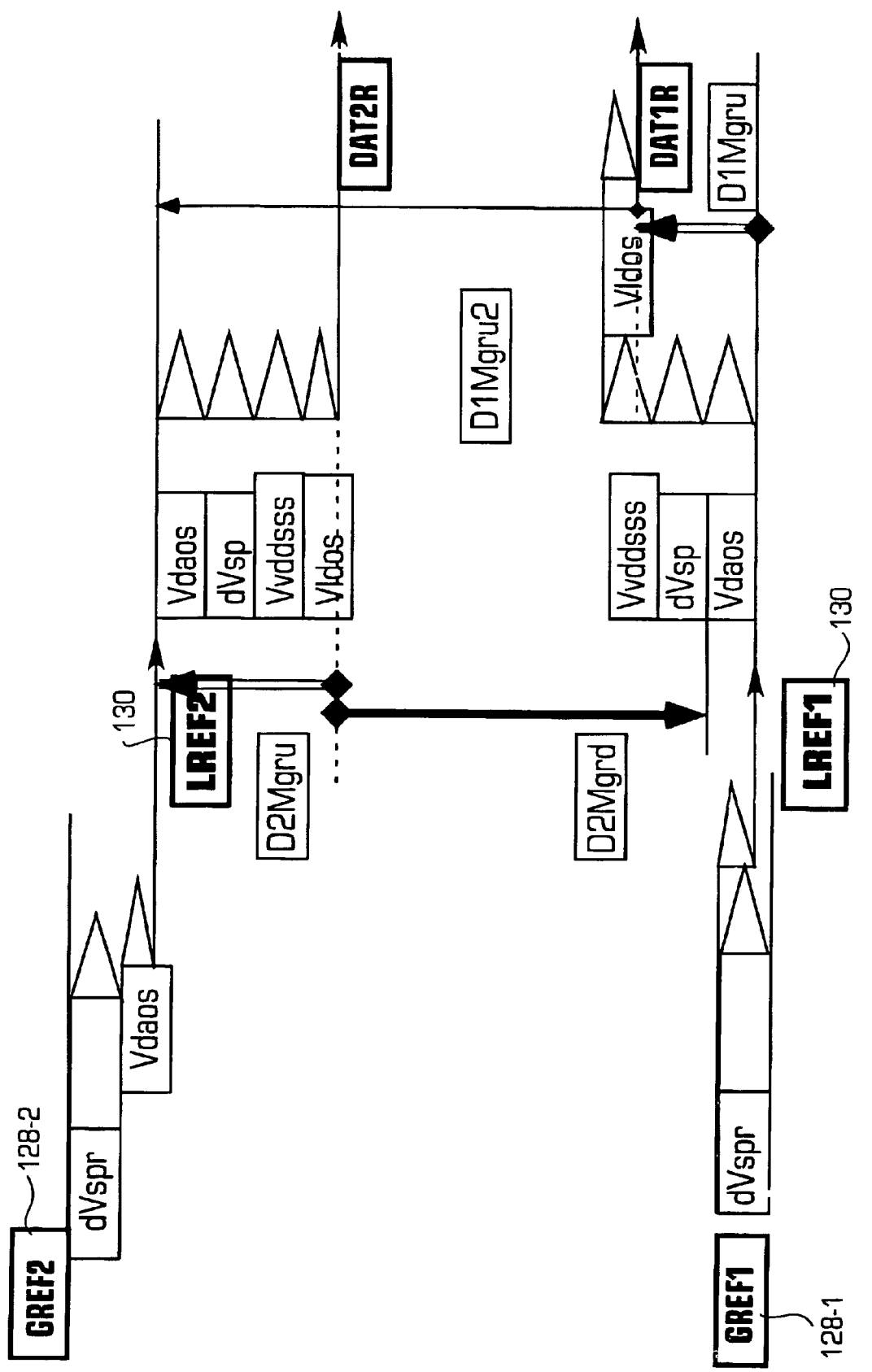
FIG. 9 is a block diagram illustrating margining of the various voltage levels of the non-volatile multilevel memory system of FIG. 1.

FIG. 9 is a block diagram illustrating margining of the non-volatile memory 100.

The margin of the memory cells 115 may be tested to determine how far above and below the recorded data is of the reference level for the next highest and next lowest memory states. The global reference voltages 128-1 and 128-2 are graphically shown spaced apart on the left side of FIG. 9. Variations between the global reference voltages 128 and corresponding local reference voltage 130 will vary by the voltage drop (DVspr) and the differential amplifier offset (Vdaos). The data range of the cell ranges between the first reference (DAT1R) and a second reference (DAT2R). The variation between the first reference (DAT1R) and the local reference 130-1 changes based on the voltage drop between ground and the supply voltage Vvddsss) and the voltage drop due to programming offset (dVsp) and the differential amplifier offset (Vdaos). The second data reference voltage (DAT2R) has an additional offset on the offset of the load voltage (Vdldos).

In this disclosure, there is shown and described only the preferred embodiments of the invention, but it is to be understood that the invention is capable of use in various other combinations and environments and is capable of changes or modifications within the scope of the inventive concept as expressed herein.

What is claimed is:

1. A differential sense amplifier for a non-volatile memory, comprising:
   a preamplifier stage providing first and second preamp output signals in response to first and second input signals; and
   a latch analog bootstrap amplifier stage coupled to the preamplifier stage to latch the first and second preamp output signals, and, in response thereto, provide first and second amplifier output signals.

2. The differential sense amplifier of claim 1 wherein the preamplifier stage comprises a latch.

3. The differential sense amplifier of claim 1 wherein the preamplifier stage comprises a latch including an initial latching amplification circuit.

4. The differential sense amplifier of claim 3 wherein the initial amplification circuit includes an analog bootstrap circuit.

5. The differential sense amplifier of claim 2 wherein the latch analog bootstrap amplifier stage comprises a first capacitor coupled between the first preamp output signal and the first amplifier output signal and a second capacitor coupled between the second preamp output signal and the second amplifier output signal.

6. The differential sense amplifier of claim 1 wherein the preamplifier stage including a gain enhancement circuit.

7. The differential sense amplifier of claim 1 wherein the latch analog bootstrap amplifier stage includes a gain enhancement circuit for post amplification.

8. A differential sense amplifier for a non-volatile memory, comprising:
   a preamplifier stage generating first and second output voltages in response to first and second input voltages; and
   an amplifier stage coupled to the preamplifier stage to generate a third output voltage in response to the first output voltage being greater than the second output voltage and generating a fourth output voltage in response to the first output voltage being less than the second output voltage, the amplifier stage comprising:
      a first transistor of a first type including a first terminal coupled to the third output voltage, including a second terminal spaced apart from said first terminal with a channel therebetween, and including a gate for controlling current in said channel and coupled to the first output voltage;
      a second transistor of the first type including a first terminal coupled to the fourth output voltage, including a second terminal spaced apart from said first terminal with a channel therebetween and coupled to the second terminal of the first transistor of the first type, and including a gate for controlling current in said channel and coupled to the second output voltage;
      a third transistor of the first type including a first terminal coupled to the second terminal of the first transistor of the first type, including a second terminal spaced apart from said first terminal with a channel therebetween and coupled to a ground terminal, and including a gate for controlling current in said channel in response to a first control signal;
      a first transistor of a second type including a first terminal coupled to a power terminal, including a second terminal spaced apart from said first terminal with a channel therebetween and coupled to the first terminal of the first transistor of the first type, and including a gate for controlling current in said channel and coupled to the first terminal of the second transistor of the first type; and a second transistor of the second type including a first terminal coupled to the power terminal, including a second terminal spaced apart from said first terminal with a channel therebetween and coupled to the first terminal of the second transistor of the first type, and including a gate for controlling current in said channel and coupled to the first terminal of the first transistor of the first type.

9. The differential sense amplifier of claim 8 further comprising a gain enhancement circuit for pulling down the third and fourth output voltage in response to the second and first output voltage being in a low state.

10. The differential sense amplifier of claim 8 further comprising:

a fourth transistor of the first type including a first terminal coupled to the first terminal of the first transistor of the first type, including a second terminal spaced apart from said first terminal with a channel therebetween, and including a gate for controlling current in said channel and coupled to the first terminal of the second transistor of the first type;

a fifth transistor of the first type including a first terminal coupled to the first terminal of the second transistor of the first type, including a second terminal spaced apart from said first terminal with a channel therebetween and coupled to the second of the fourth transistor of the first type and including a gate for controlling current in said channel and coupled to the first terminal of the fourth transistor of the first type; and a sixth transistor of the first type including a first terminal coupled to the second terminal of the fourth transistor of the first type, including a second terminal spaced apart from said first terminal with a channel therebetween and coupled to a ground terminal, and including a gate for controlling current in said channel in response to a second control signal.

11. The differential sense amplifier of claim 10 further comprising:

a first capacitor coupled between the gate of the first transistor of the second type and the first output voltage; and a second capacitor coupled between the gate of the second transistor of the second type and the second output voltage.

12. The differential sense amplifier of claim 11 further comprising an equalization circuit for equalizing the voltage of the third and fourth output voltages prior to application of the first and second input voltages.

13. The differential sense amplifier of claim 12 wherein the second control signal is applied after the equalization of the equalization circuit.

14. A differential sense amplifier for a non-volatile memory, comprising:

a preamplifier stage generating first and second output voltages in response to first and second input voltages, the preamplifier stage including a folded cascode amplifier and a gain enhancement circuit; and an amplifier stage coupled to the preamplifier stage to generate a third output voltage in response to the first output voltage being greater than the second output voltage and generating a fourth output voltage in response to the first output voltage being less than the second output voltage.

15. The differential sense amplifier of claim 14 wherein the gain enhancement circuit comprises:

a first transistor of a first type including a first terminal coupled to the second output voltage, including a second terminal spaced apart from first terminal with a channel therebetween and coupled to a ground terminal, and including a gate for controlling current in said channel and coupled to the first output voltage; and a second transistor of the first type including a first terminal coupled to the first output voltage, including a second terminal spaced apart from said first terminal with a channel therebetween and coupled to the ground terminal, and including a gate for controlling current in said channel and coupled to the second output voltage.

16. The differential sense amplifier of claim 14 wherein the prestage amplifier comprises:

a first transistor of a first type including a first terminal, including a second terminal spaced apart from said first terminal with a channel therebetween, and including a gate for controlling current in said channel in response to the first input voltage;

a second transistor of the first type including a first terminal, including a second terminal spaced apart from said first terminal and coupled to the second terminal of the first transistor of the first type, and including a gate for controlling current in said channel in response to the second input voltage;

a third transistor of the first type including a first terminal coupled to the second terminal of the first transistor of the first type, including a second terminal spaced apart from said first terminal with a channel therebetween and coupled to a ground terminal, and including a gate for controlling a current in said channel in response to a first control signal;

a first transistor of a second type including a first terminal coupled to a power terminal, including a second terminal spaced apart from said first terminal with a channel therebetween and coupled to the first terminal of the first transistor of the first type, and including a gate for controlling current in said channel;

a second transistor of the second type including a first terminal coupled to the power terminal, including a second terminal spaced apart from said first terminal with a channel therebetween and coupled to the first terminal of the second transistor of the first type, and including a gate for controlling current in said channel and coupled to the gate of the first transistor of the second type;

a third transistor of the second type including a first terminal coupled to the power terminal, including a second terminal spaced apart from said first terminal with a channel therebetween and coupled to the gate of the first transistor of the second type, and including a gate for controlling current in said channel and coupled to the second terminal of the third transistor of the second type;

a fourth transistor of the first type including a first terminal coupled to the second terminal of the third transistor of the second type, including a second terminal spaced apart from said first terminal with a channel therebetween and coupled to the ground terminal, and including a gate for controlling current in said channel in response to the first control signal;

a fourth transistor of the second type including a first terminal coupled to the power terminal, including a second terminal spaced apart from said first terminal with a channel therebetween, and including a gate for controlling current in said channel and coupled to said second terminal;

a fifth transistor of the first type including a first terminal coupled to the second terminal of the fourth transistor of the second type, including a second terminal spaced apart from said first terminal with a channel therebetween and coupled to the ground terminal, and including a gate for controlling current in said channel in response to the first control signal;

a fifth transistor of the second type including a first terminal coupled to the second terminal of the first transistor of the second type, including a second terminal spaced apart from said first terminal with a channel therebetween and coupled to the second output voltage, and including a gate for controlling current in said channel and coupled to the second terminal of the fourth transistor of the second type;

a sixth transistor of the first type including a first terminal coupled to the second terminal of the fifth transistor of the second type, including a second terminal spaced apart from said first terminal with a channel therebetween and coupled to the ground terminal, and including a gate for controlling current in said channel and coupled to the second terminal of the fifth transistor of the second type;

a sixth transistor of the second type including a first terminal coupled to the second terminal of the second transistor of the second type, including a second terminal spaced apart from said first terminal with a channel therebetween and coupled to the first output voltage, and including a gate for controlling current in said channel and coupled to the second terminal of the fourth transistor of the second type; and a seventh transistor of the first type including a first terminal coupled to the second terminal of the sixth transistor of the second type, including a second terminal spaced apart form said first terminal with a channel therebetween and coupled to the ground terminal, and including a gate for controlling current in said channel and coupled to said first terminal.

17. The differential sense amplifier of claim 16 further comprising:

an eighth transistor of the first type including a first terminal coupled to the first terminal of the seventh transistor of the first type, including a second terminal spaced apart from said first terminal with a channel therebetween and coupled to a ground terminal, including the gate for controlling current in said channel and coupled to the first terminal of the sixth transistor of the first type; and a ninth transistor of the first type including a first terminal coupled to the first terminal of the sixth transistor of the first type, including a second terminal spaced apart from said first terminal with a channel therebetween and coupled to the ground terminal, and including a gate for controlling current in said channel and coupled to the first terminal of the seventh transistor of the first type.

18. The differential sense amplifier of claim 14 wherein the preamplifier stage further comprises a clamp circuit to equalize internal voltages of the folded cascode amplifier.

19. The differential sense amplifier of claim 14 wherein the folded cascode amplifier generates first and second internal voltages in response to the first and second input voltages and generates said first and second output voltages in response to the first and second internal voltages, and the folded cascode amplifier further comprises:

a first transistor of a first type including a first terminal coupled to the first internal voltage, including a second terminal spaced apart from said first terminal with a channel therebetween and coupled to said second internal voltage, and including a gate for controlling current in said channel and coupled to said second terminal, and a second transistor of the first type including a first terminal coupled to the first internal voltage, including a second terminal spaced apart from said first terminal with a channel therebetween and coupled to said second internal voltage, and including a gate for controlling the current in said channel and coupled to said first terminal.

20. The differential sense amplifier of claim 14 wherein the amplifier stage includes an analog bootstrap circuit.

21. The differential sense amplifier of claim 20 wherein the analog bootstrap circuit comprises a first capacitor coupled between the first output voltage and the third output voltage, and further comprises a second capacitor coupled between the second output voltage and the fourth output voltage.

22. The differential sense amplifier of claim 14 wherein the amplifier stage comprises a gain enhancement circuit for pulling down the third and fourth output voltages in response to the second and first output voltages being in a low state.

23. The differential sense amplifier of claim 22 wherein the post amplification circuit comprises:

a first transistor of a first type including a first terminal coupled to the third output voltage, including a second terminal spaced apart from said first terminal with a channel therebetween, and including a gate for controlling current in said channel and coupled to the fourth output voltage, a second transistor of the first type including a first terminal coupled to the fourth output voltage, including a second terminal spaced apart from said first terminal with a channel therebetween and coupled to the second terminal of the first transistor of the first type, and including a gate for controlling current in said channel and coupled to the third output voltage, and a third transistor of the first type including a first terminal coupled to the second terminal of the first transistor of the first type, including a second terminal spaced apart from said first terminal with a channel therebetween and coupled to a ground terminal, and including a gate for controlling current in said channel in response to a control signal.

* * * * *